(12) United States Patent
Kim et al.

(10) Patent No.: US 9,029,263 B1
(45) Date of Patent: May 12, 2015

(54) METHOD OF PRINTING MULTIPLE STRUCTURE WIDTHS USING SPACER DOUBLE PATTERNING

(71) Applicant: Texas Instruments Incorporated, Dallas, TX (US)

(72) Inventors: Ryoung-han Kim, Plano, TX (US); Youn Sung Choi, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/500,002

(22) Filed: Sep. 29, 2014

Related U.S. Application Data

(60) Provisional application No. 61/915,006, filed on Dec. 12, 2013.

(51) Int. Cl.
| | |
|---|---|
| *H01L 21/02* | (2006.01) |
| *H01L 21/8234* | (2006.01) |
| *H01L 21/28* | (2006.01) |
| *H01L 21/311* | (2006.01) |
| *H01L 21/306* | (2006.01) |
| *H01L 21/308* | (2006.01) |
| *H01L 21/3213* | (2006.01) |

(52) U.S. Cl.
CPC ...... *H01L 21/823437* (2013.01); *H01L 21/823431* (2013.01); *H01L 21/28035* (2013.01); *H01L 21/31111* (2013.01); *H01L 21/30604* (2013.01); *H01L 21/308* (2013.01); *H01L 21/32133* (2013.01); *H01L 21/32139* (2013.01); *H01L 21/02164* (2013.01); *H01L 21/0217* (2013.01)

(58) Field of Classification Search
CPC ............ H01L 21/0337; H01L 21/0338; H01L 21/02518; H01L 21/0332; H01L 21/2815; H01L 21/28273; H01L 21/3086; H01L 21/3088; H01L 21/32139; H01L 27/11517; H01L 27/11519; H01L 27/11521; H01L 27/11524
See application file for complete search history.

(56) References Cited

U.S. PATENT DOCUMENTS

| | | | | |
|---|---|---|---|---|
| 6,667,237 | B1 * | 12/2003 | Metzler .................... | 438/690 |
| 6,706,571 | B1 * | 3/2004 | Yu et al. .................... | 438/157 |
| 8,390,034 | B2 * | 3/2013 | Tran .......................... | 257/206 |
| 2005/0153562 | A1 * | 7/2005 | Furukawa et al. ........... | 438/694 |
| 2007/0049040 | A1 * | 3/2007 | Bai et al. ..................... | 438/712 |

* cited by examiner

*Primary Examiner* — Stephen W Smoot
*Assistant Examiner* — Edward Chin
(74) *Attorney, Agent, or Firm* — Jacqueline J. Garner; Frank Cimino

(57) ABSTRACT

An integrated circuit containing linear structures on regular pitch distances may be formed by forming linear mandrels over a layer of material for the linear structures, with mandrel pitch distances that are twice the desired linear structures' pitch distances. Mandrels for a first plurality of linear structures are shortened. A layer of spacer material is conformally formed over the mandrels and anisotropically etched back to form spacers on lateral surfaces of the mandrels. Spacers on the shortened mandrels are narrower than spacers on the unshortened mandrels as a result of the anisotropic etchback. The mandrels are removed, leaving the spacers in place to form a spacer-based etch mask for the linear structures. The layer of material for the linear structures is etched using the spacer-based etch mask to form the linear structures. The linear structures from the shortened mandrels have lower widths than the linear structures from the unshortened mandrels.

20 Claims, 26 Drawing Sheets

METHOD OF PRINTING MULTIPLE STRUCTURE WIDTHS USING SPACER DOUBLE PATTERNING

CROSS-REFERENCE TO RELATED APPLICATIONS

This application claims the benefit of priority under U.S.C. §119(e) of U.S. Provisional Application 61/915,006, filed Dec. 12, 2013, which is hereby incorporated by reference in its entirety.

FIELD OF THE INVENTION

This invention relates to the field of integrated circuits. More particularly, this invention relates to MOS transistors in integrated circuits.

BACKGROUND OF THE INVENTION

An integrated circuit may contain metal oxide semiconductor (MOS) transistors with gate lengths less than 30 nanometers and gate pitch distances less than 100 nanometers. It may be desirable for some gates to have more narrow widths than other gates, for example in some logic circuits or in static random access memory (SRAM) cells. Lithography processes for forming the gates may use an illumination source, for example a 193 nanometer argon-fluoride excimer laser may be incapable of directly printing an etch mask for the gates at the desired pitch distances and widths. One approach to forming the etch mask for the gates is to perform two or more pattern steps, patterning a subset of the gates in each pattern step. Double or multiple patterning can print gates with two different widths, but extra patterning undesirably increases fabrication cost and process complexity of the integrated circuit. Another approach is to form a gate etch mask from a spacer layer deposited over mandrels. An etch mask for the mandrels for all the gates can be printed in one pattern step. However, gate lengths of the gate etch mask are determined by the thickness of the deposited spacer layer, and so forming gates with two different widths may be problematic. Similar limitations may be noted in regard to an integrated circuit containing fin field effect transistors (finFETs) with fins on pitch distances that are smaller than the single-pattern capability of the photolithographic process. Forming fins with two different fin widths may be problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing linear structures on regular pitch distances and with a first plurality of the linear features having a first width and a second plurality of the linear structures having a second width, in which the first width is less than the second width, may be formed by forming linear mandrels over a layer of material for the linear structures. The mandrels are formed with pitch distances that are twice the desired pitch distances of the linear structures. Mandrels for the first plurality of linear structures are shortened. A layer of spacer material is conformally formed over the mandrels and anisotropically etched back to form spacers on lateral surfaces of the mandrels. Spacers on the shortened mandrels, that is mandrels of the first plurality of linear structures, are narrower than spacers on the unshortened mandrels, that is mandrels of the second plurality of linear structures, as a result of the anisotropic etchback. The mandrels are removed, leaving the spacers in place to form a spacer-based etch mask for the linear structures. The layer of material for the linear structures is etched using the spacer-based etch mask to form the linear structures having the first plurality and the second plurality with the desired respective widths.

DETAILED DESCRIPTION OF EXAMPLE EMBODIMENTS

Figure 1A:
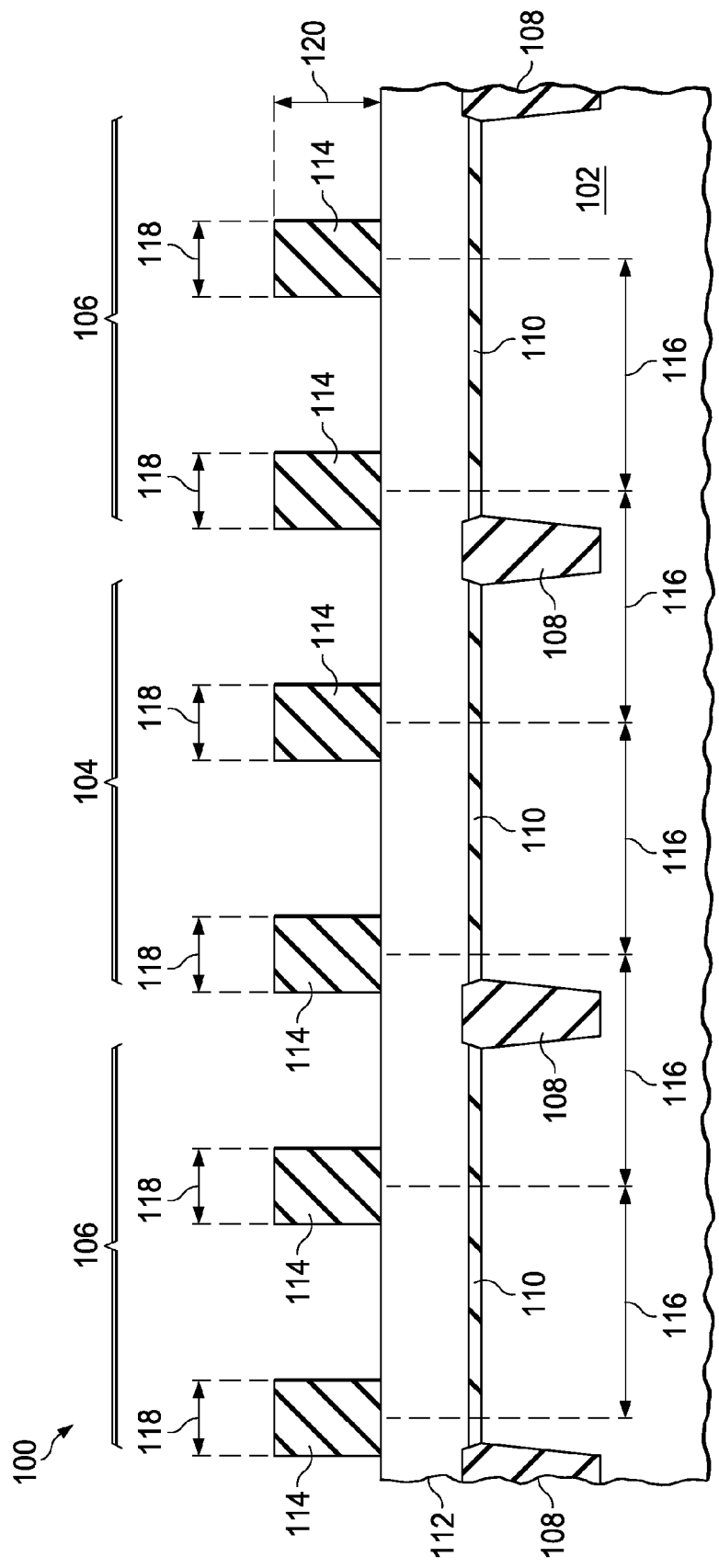
FIG. 1A through FIG. 1I are cross sections of an integrated circuit containing planar MOS transistors formed by an example process sequence, depicted in successive stages of fabrication.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following application contains related material and is hereby incorporated in its entirety: application Ser. No. 14/499,957 entitled "DESIGN AND INTEGRATION OF FINFET DEVICE" filed concurrently with this application.

An integrated circuit containing linear structures on regular pitch distances and with a first plurality of the linear features having a first width and a second plurality of the linear structures having a second width, in which the first width is less than the second width, may be formed by forming linear mandrels over a layer of material for the linear structures. The mandrels are formed with pitch distances that are twice the desired pitch distances of the gates. Mandrels for the first plurality of linear structures are shortened. A layer of spacer material is conformally formed over the mandrels and anisotropically etched back to form spacers on lateral surfaces of the mandrels. Spacers on the shortened mandrels, that is mandrels of the first plurality of linear structures, are narrower than spacers on the unshortened mandrels, that is mandrels of the second plurality of linear structures, as a result of the anisotropic etchback. The mandrels are removed, leaving the spacers in place to form a spacer-based etch mask for the linear structures. The layer of material for the linear structures is etched using the spacer-based etch mask to form the linear structures having the first plurality and the second plurality with the desired respective widths.

Forming the linear structures as described may advantageously provide the first plurality of the linear features having the first, more narrow, width and the second plurality of the linear structures having the second, wider, width, at a fabrication cost for the integrated circuit lower than using a process sequence using double patterning.

One version of the integrated circuit may contain planar MOS transistors, in which the layer of material for the linear structures is a layer of gate material, and the linear structures are gates of the MOS transistors, with a first plurality of gates having a first width and a second plurality of gates having a second width, in which the first width is less than the second width. The gates may be formed on regular pitch distances.

Another version of the integrated circuit may contain finFETs, in which the layer of material for the linear structures is semiconductor material at a top of a substrate of the integrated circuit, and the linear structures are fins of the finFETs, with a first plurality of fins having a first fin width and a second plurality of fins having a second fin width, in which the first fin width is less than the second fin width. The fins may be formed on regular pitch distances. For the purposes of this disclosure, the term width as applied to a gate refers to a physical width of the gate, in the direction of current flow in a channel region under the gate. For the purposes of this disclosure, the term "pitch distance" refers to a lateral distance between centers of adjacent instances of identical structures such as gates, fins or mandrels.

A further version of the integrated circuit may contain finFETs, in which the layer of material for the linear structures is a layer of gate material, and the linear structures are gates of the finFETs, with a first plurality of gates having a first width and a second plurality of gates having a second width, in which the first width is less than the second width. The gates may be formed on regular pitch distances.

FIG. 1A through FIG. 1I are cross sections of an integrated circuit containing planar MOS transistors formed by an example process sequence, depicted in successive stages of fabrication. Referring to FIG. 1A, the integrated circuit 100 is formed on a substrate 102 such as a silicon wafer. The integrated circuit 100 includes at least one area for a first plurality of gates 104 of MOS transistors and at least one area for a second plurality of gates 106 of MOS transistors. A desired width of the to-be-formed first plurality of gates 104 is less than a desired width of the to-be-formed second plurality of gates 106. Field oxide 108 may be formed at a top surface of the substrate 102 to laterally isolate components such as transistors. A gate dielectric layer 110 is formed at the top surface of the substrate 102 in the area for the first plurality of gates 104 and the areas for the second plurality of gates 106.

A layer of gate material 112 is formed over the gate dielectric layer 110. The layer of gate material 112 may include, for example, 20 nanometers to 50 nanometers of polycrystalline silicon, commonly referred to as polysilicon, and/or may include metallic gate material such as titanium nitride or tantalum nitride. Mandrels 114 are formed over the layer of gate material 112 with pitch distances 116 which are twice as long as desired pitch distances of gates of the first plurality of gates 104 and the second plurality of gates 106. The mandrels 114 may be formed with widths 118 which provide desired separations between adjacent instances of the first plurality of gates 104 and the second plurality of gates 106. Instances of the mandrels 114 may possibly extend past boundaries of the area for the first plurality of gates 104 or the areas for the second plurality of gates 106 as depicted in FIG. 1A. The mandrels 114 may include, for example, silicon dioxide and/or silicon nitride, and be formed by forming a layer of mandrel material over the layer of gate material 112, forming an etch mask of photoresist on the layer of mandrel material and etching the mandrel material using a reactive ion etch (RIE) process. Alternately, the mandrels 114 may be formed of photosensitive polyimide using a photolithographic process. Other materials and methods of formation for the mandrels 114 are within the scope of the instant example. A height 120 of the mandrels 114 may be, for example, two to four times the desired width of the second plurality of gates 106.

Figure 1B:
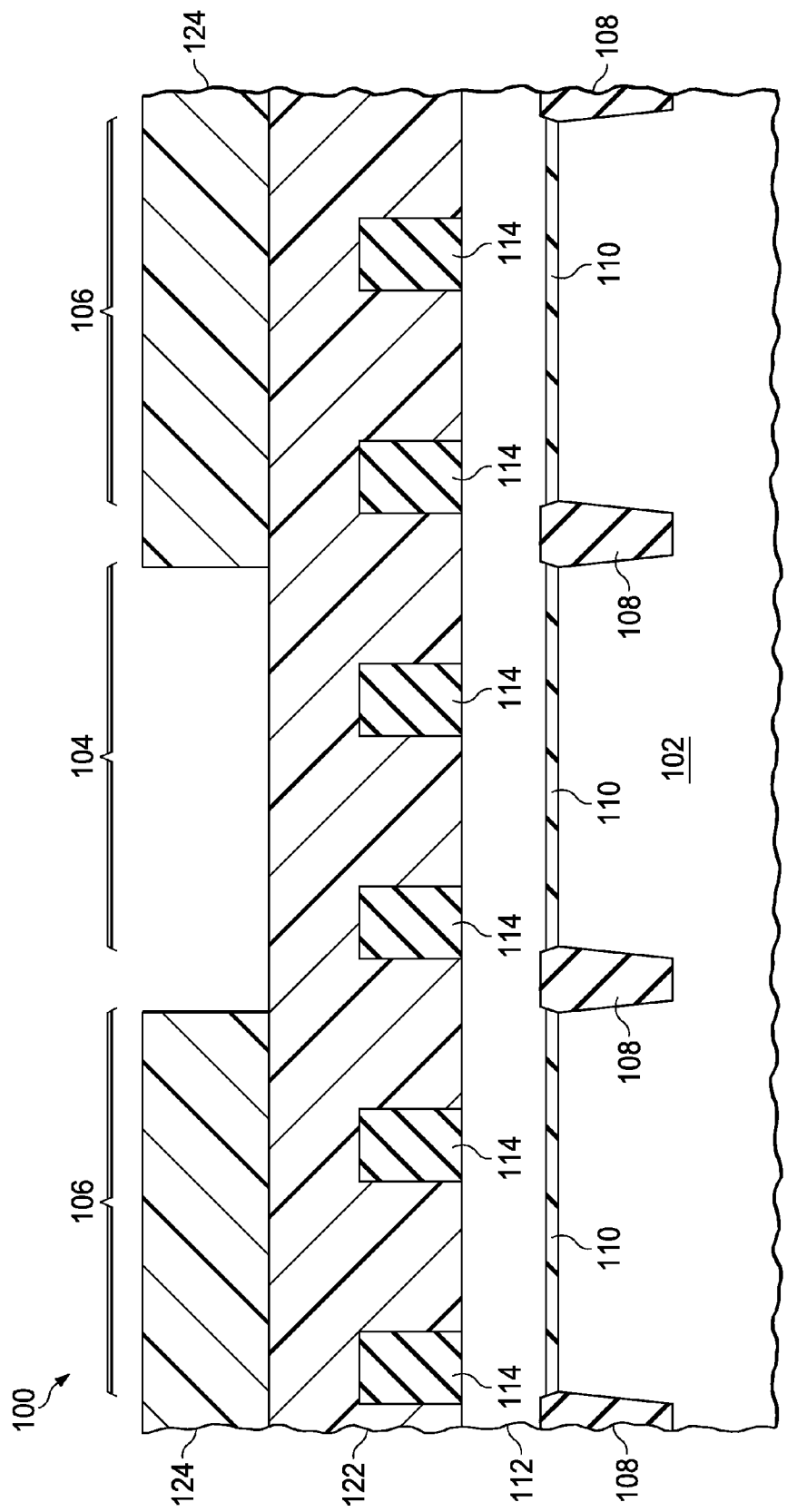

Referring to FIG. 1B, a layer of mask material 122 is formed over the mandrels 114 and the layer of gate material 112. The layer of mask material 122 may include, for example, organic polymer used as a bottom anti-reflection coat (BARC), or may include amorphous carbon used for a more durable mask. A photoresist pattern 124 is formed over the layer of mask material 122 which exposes the area for the first plurality of gates 104 and covers the areas for the second plurality of gates 106. The photoresist pattern 124 may be formed using a low resolution process which advantageously reduces a fabrication cost of the integrated circuit 100.

Figure 1C:
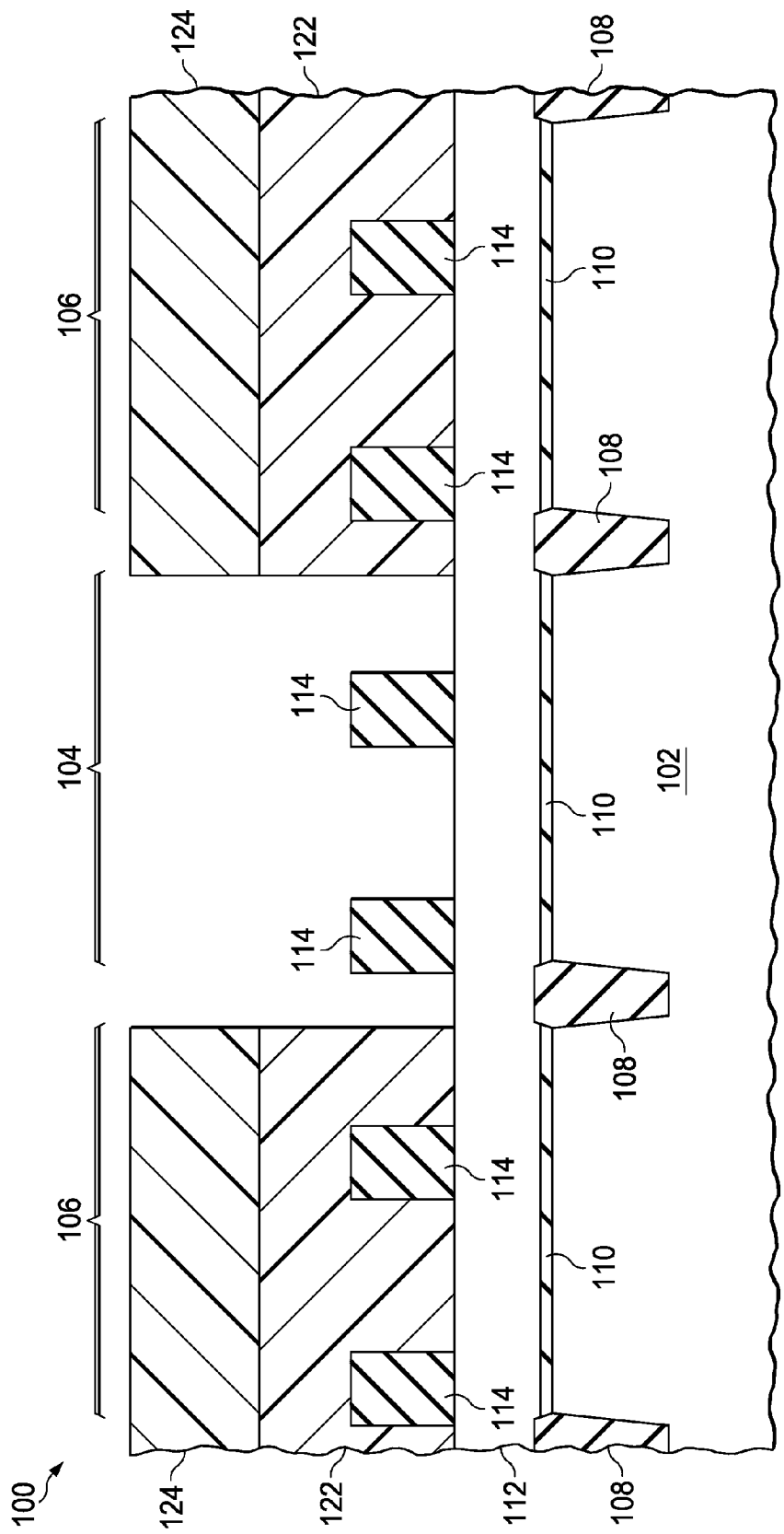

Referring to FIG. 1C, the layer of mask material 122 is removed in the areas exposed by the photoresist pattern 124, including the area for the first plurality of gates 104, and is left in areas covered by the photoresist pattern 124, including the areas for the second plurality of gates 106. The layer of mask material 122 may be removed, for example, by an anisotropic plasma etch process or an RIE process which is selective to the mandrels 114 and the layer of gate material 112. The photoresist pattern 124 may be subsequently removed, or may be left in place.

Figure 1D:
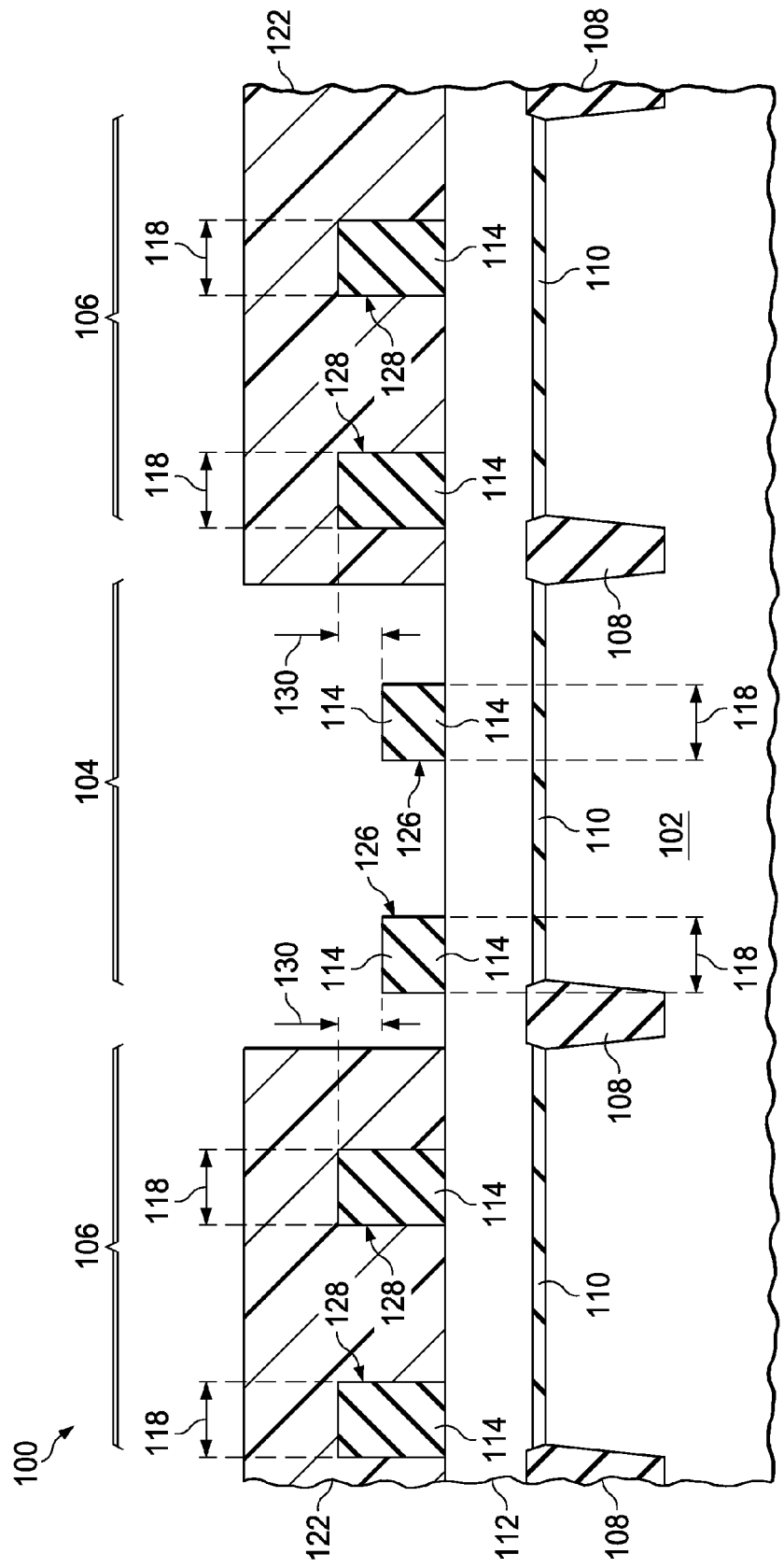

Referring to FIG. 1D, instances 126 of the mandrels 114 in the area of the first plurality of gates 104 are shortened, for example by an anisotropic etch. The shortening process may not substantially decrease the widths 118 of the instances 126 of the mandrels 114 in the area of the first plurality of gates 104. Instances 128 of the mandrels 114 in the areas of the second plurality of gates 106 are protected by the layer of mask material 122 and so are not substantially affected by the shortening process. After the shortening process is completed, the instances 126 of the mandrels 114 in the area of the first plurality of gates 104 may be shorter than the instances 128 of the mandrels 114 in the areas of the second plurality of gates 106 by a vertical distance 130 of, for example, one to three times the desired width of the to-be-formed second plurality of gates 106. After the shortening process is completed, the layer of mask material 122 is removed. The layer of mask material 122 may be removed using an etch process which does not substantially degrade the mandrels 114 or the layer of gate material 112. Organic material in the layer of mask material 122 may be removed using an asher process. Inorganic material in the layer of mask material 122 may be removed using an isotropic plasma etch process.

Figure 1E:
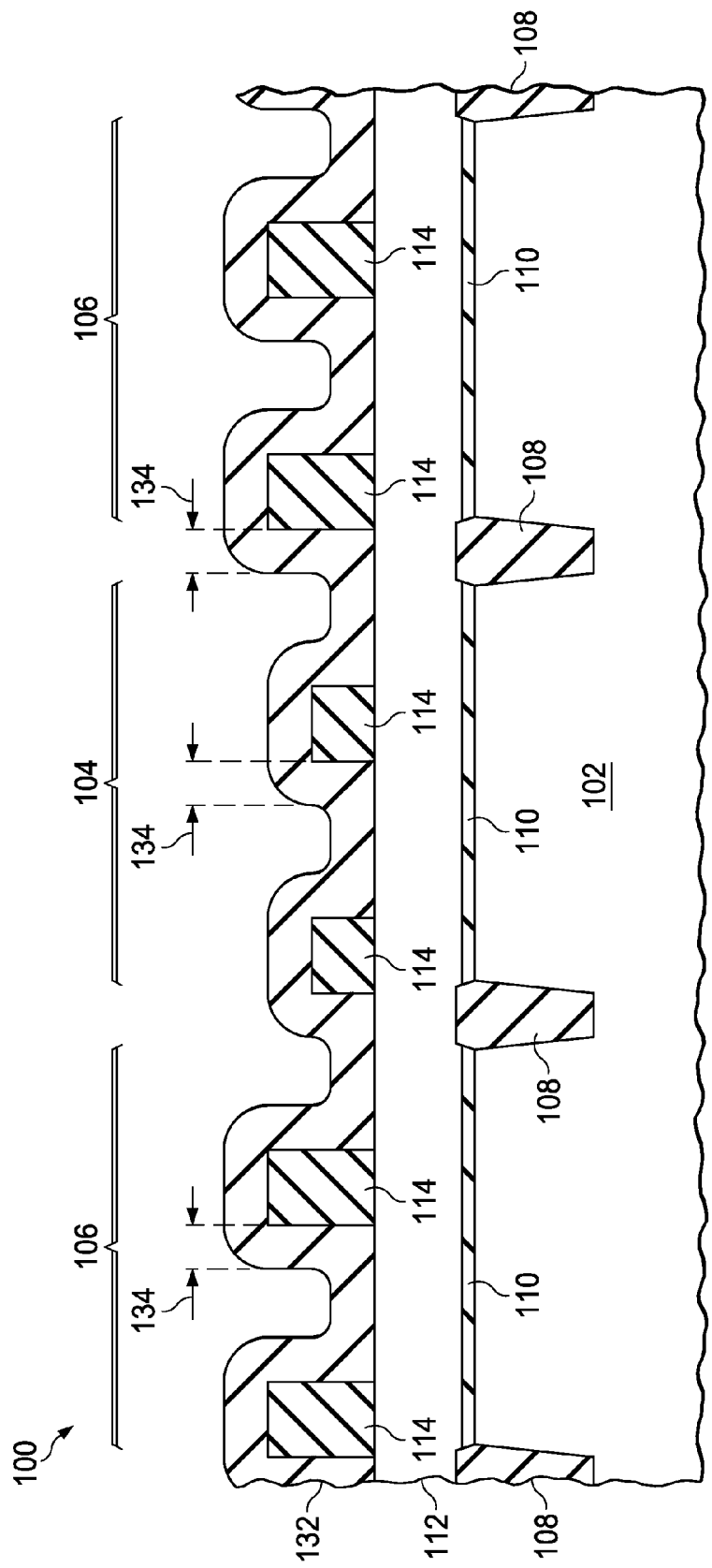

Referring to FIG. 1E, a layer of spacer material 132 is conformally formed over the mandrels 114 and the layer of gate material 112. The layer of spacer material 132 may include, for example, silicon dioxide or silicon nitride. A horizontal thickness 134 of the layer of spacer material 132 on lateral surfaces of the mandrels 114 is approximately the desired width of the to-be-formed second plurality of gates 106.

Figure 1F:
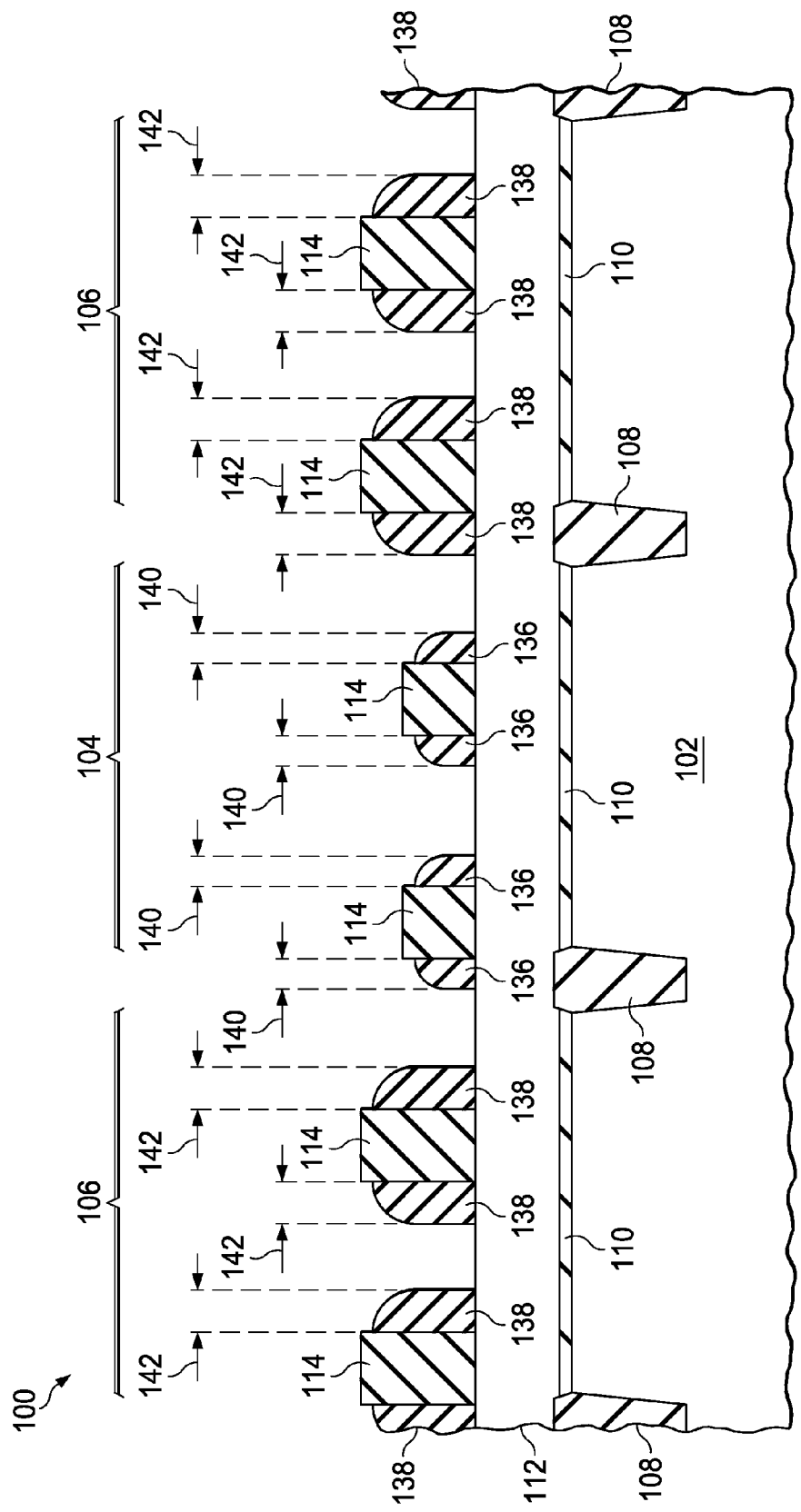

Referring to FIG. 1F, the layer of spacer material 132 of FIG. 1E is anisotropically etched back to form a first plurality of spacers 136 on the instances 126 of the mandrels 114 in the area of the first plurality of gates 104 and to form a second plurality of spacers 138 on the instances 128 of the mandrels 114 in the areas of the second plurality of gates 106. The anisotropic etchback is performed so that a horizontal thickness 140 of the first plurality of spacers 136 is less than a horizontal thickness 142 of the second plurality of spacers 138. The horizontal thickness 140 of the first plurality of spacers 136 is approximately the desired width of the to-be-formed first plurality of gates 104. The horizontal thickness 142 of the second plurality of spacers 138 is approximately the desired width of the to-be-formed second plurality of gates 106.

Figure 1G:
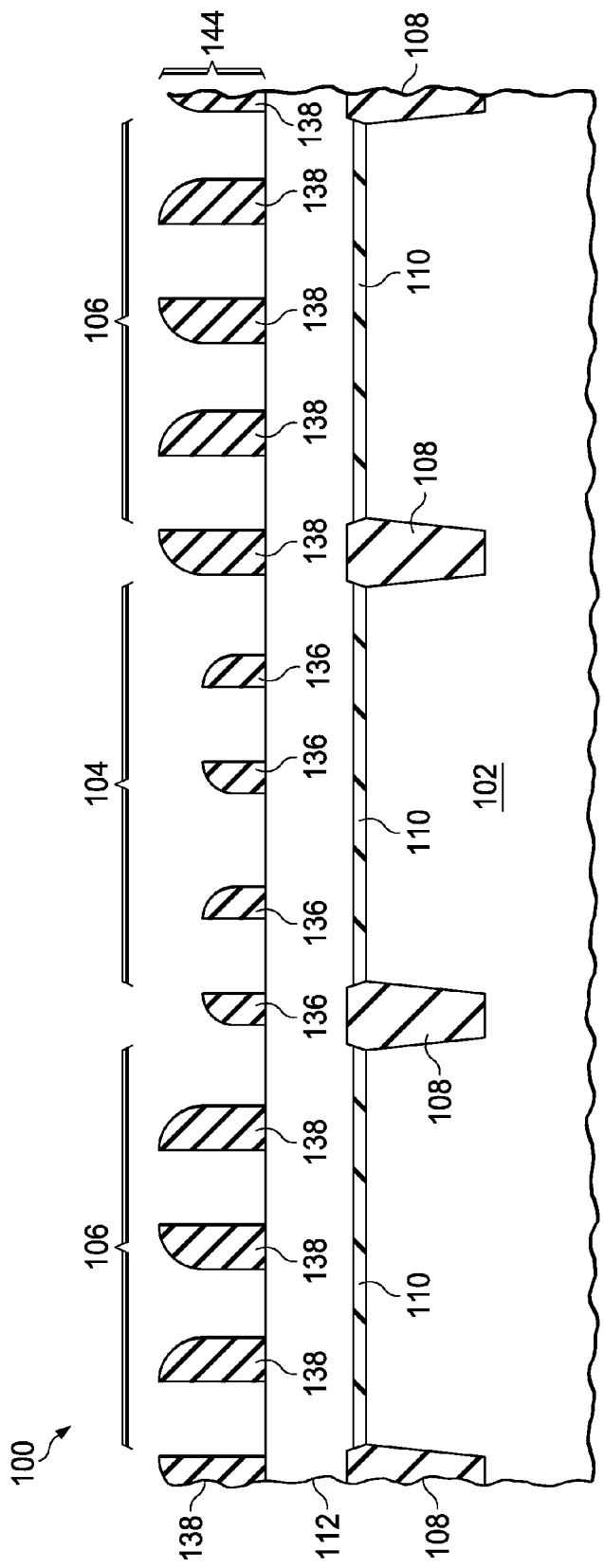

Referring to FIG. 1G, the mandrels 114 of FIG. 1F are removed, leaving the first plurality of spacers 136 and the second plurality of spacers 138 in place to form a spacer-based etch mask 144. The mandrels 114 may be removed using a wet etch which is selective to the spacers 136 and 138 and the layer of gate material 112. For example, silicon dioxide in the mandrels 114 may be removed from silicon nitride-based spacers 136 and 138 and a layer of gate material 112 of polysilicon using a dilute aqueous etch of buffered hydrofluoric acid. In another example, polyimide in the mandrels 114 may be removed from silicon dioxide-based spacers 136 and 138 and a layer of gate material 112 of polysilicon using an asher process followed by a wet clean step using an aqueous mixture of sulfuric acid and hydrogen peroxide.

Figure 1H:
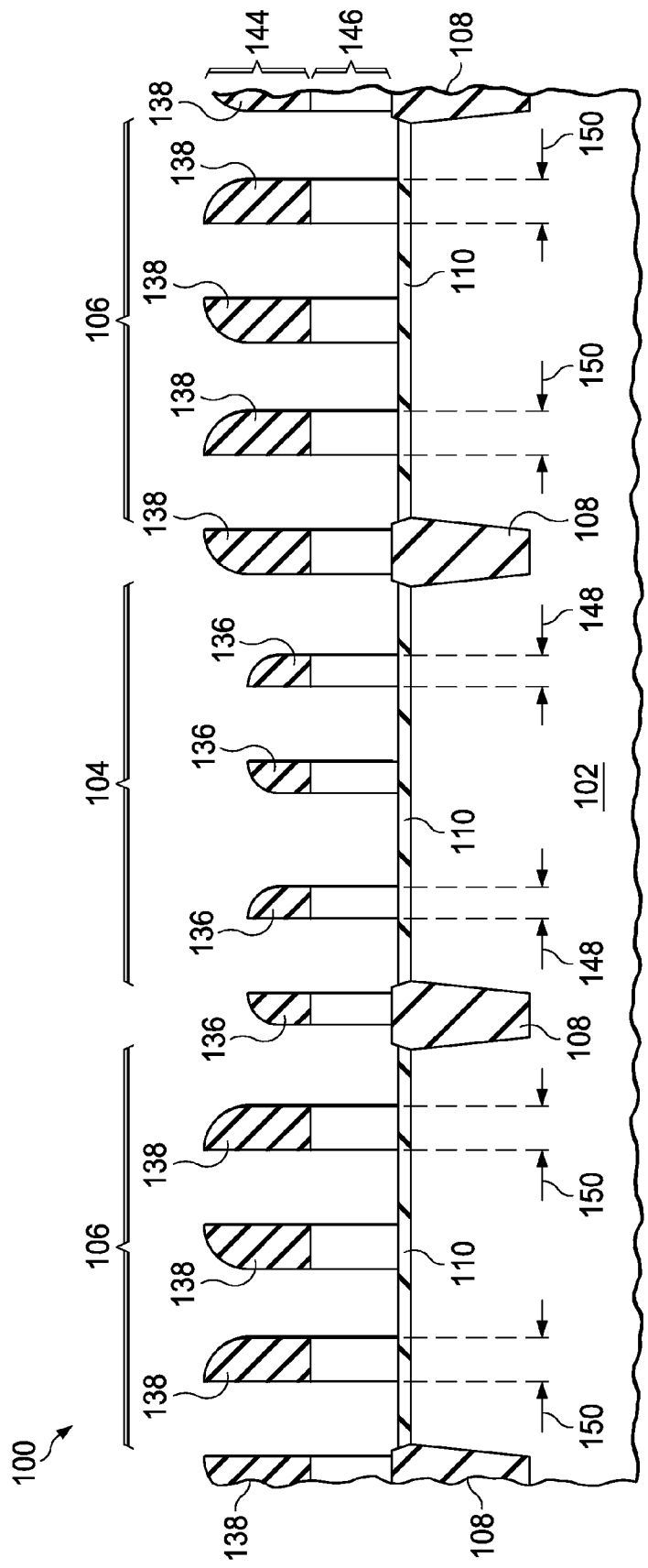

Referring to FIG. 1H, the layer of gate material 112 of FIG. 1G is etched using the spacer-based etch mask 144 to form gates 146 including the first plurality of gates 104 and the second plurality of gates 106. A width 148 of the first plurality of gates 104 is less than a width 150 of the second plurality of gates 106. Instances of the gates 146 may be formed over the field oxide 108 as a consequence of forming the gates 146 on substantially constant pitch distances.

Figure 1I:
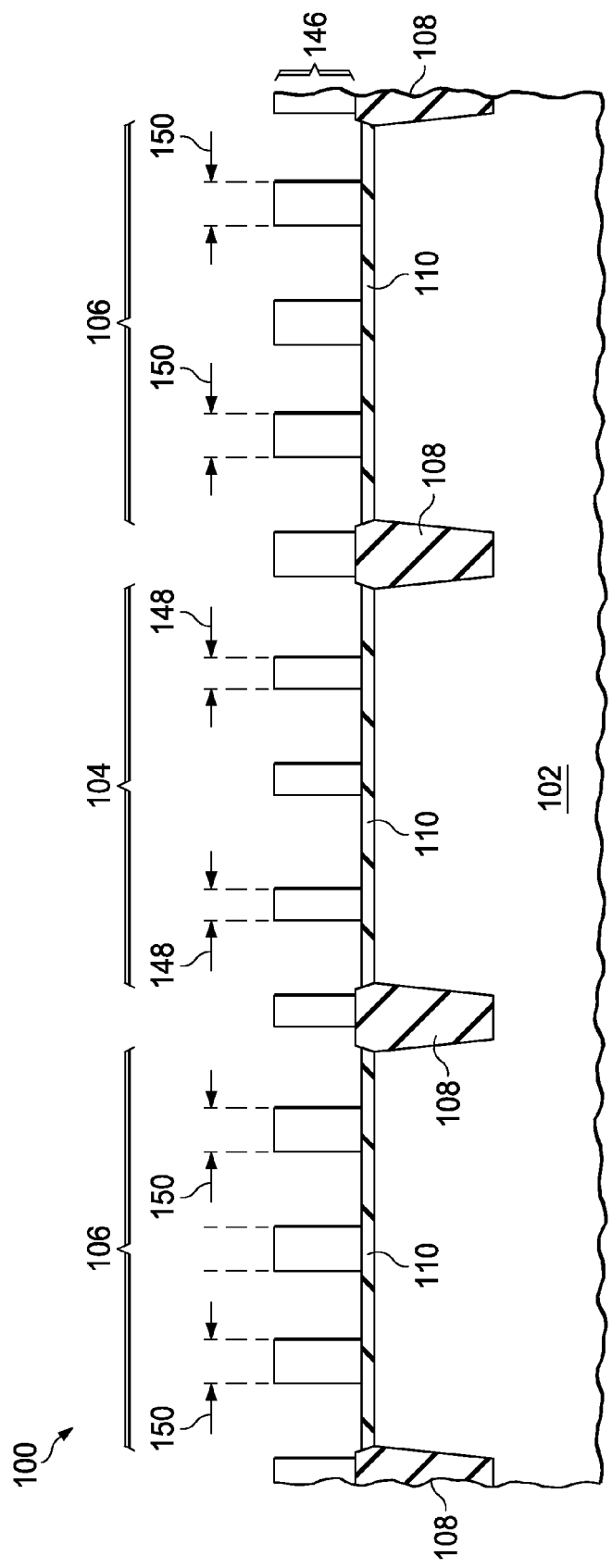

Referring to FIG. 1I, the spacer-based etch mask 144 of FIG. 1H is removed, leaving the gates 146 in place. The spacer-based etch mask 144 may be removed using an etch process which is selective to the gates 146. Silicon dioxide in the spacer-based etch mask 144 may be removed using a dilute aqueous etch of buffered hydrofluoric acid after protecting the gate dielectric layer 110, possibly with a spin-on coating. Silicon nitride in the spacer-based etch mask 144 may be removed using a plasma etch with fluorine radicals. The gates 146 may possibly be replaced with metal gates in subsequent processing.

Figure 2A:
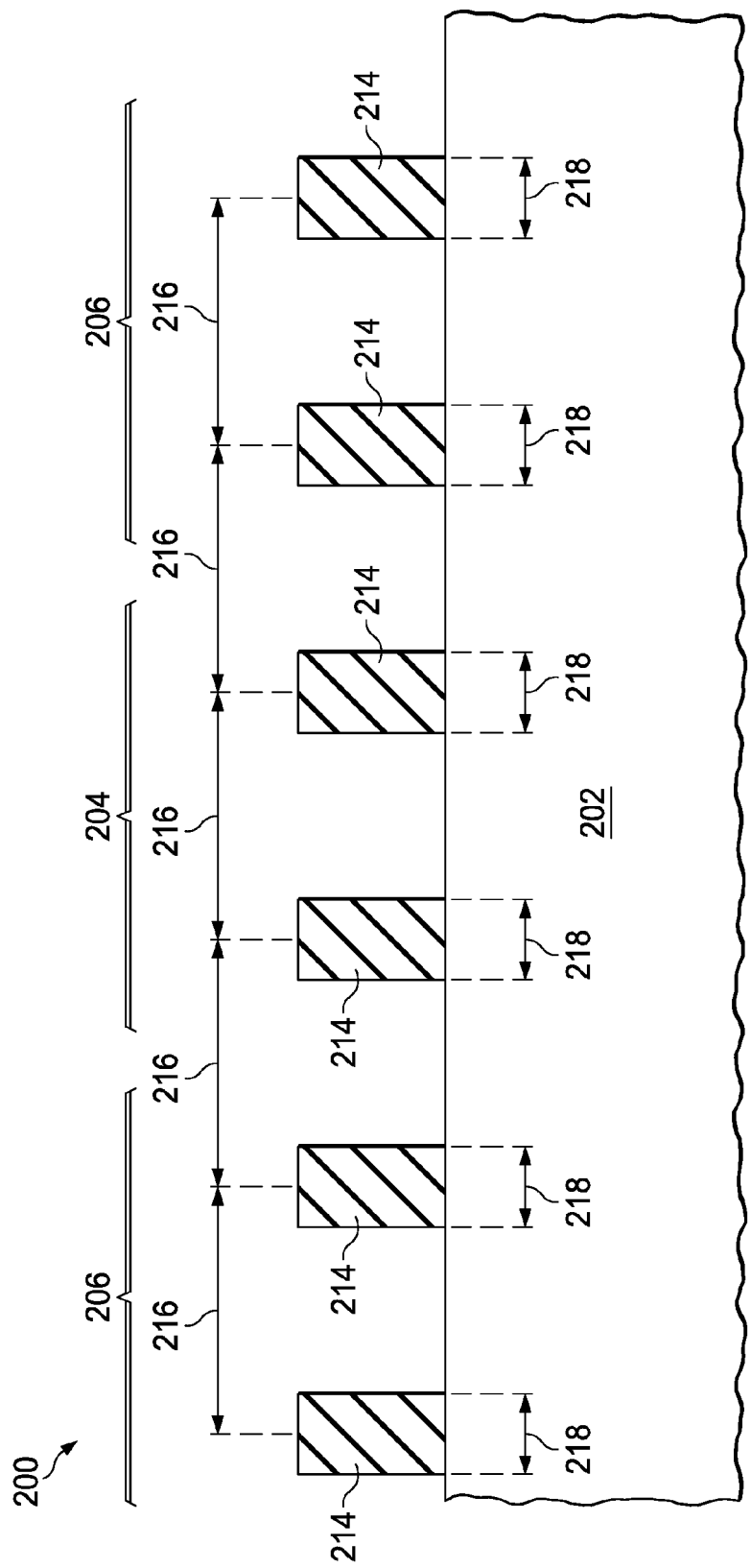
FIG. 2A through FIG. 2H are cross sections of an integrated circuit containing finFETs formed by another example process sequence, depicted in successive stages of fabrication.

FIG. 2A through FIG. 2H are cross sections of an integrated circuit containing finFETs formed by another example process sequence, depicted in successive stages of fabrication. Referring to FIG. 2A, the integrated circuit 200 is formed on a substrate 202 with semiconductor material at a top surface, such as a silicon wafer. The integrated circuit 200 includes at least one area for a first plurality of fins 204 of finFETs and at least one area for a second plurality of fins 206 of finFETs. A desired width of the to-be-formed first plurality of fins 204 is less than a desired width of the to-be-formed second plurality of fins 206.

Mandrels 214 are formed over the substrate 202 with pitch distances 216 which are twice as long as desired pitch distances of fins of the first plurality of fins 204 and the second plurality of fins 206. The mandrels 214 may be formed with widths 218 which provide desired separations between adjacent instances of the first plurality of fins 204 and the second plurality of fins 206. The mandrels 214 may include silicon dioxide or polyimide and be formed as described in reference to FIG. 1A. Other materials and methods of formation for the mandrels 214 are within the scope of the instant example. A height of the mandrels 214 may be, for example, two to four times the desired width of the second plurality of fins 206.

Figure 2B:
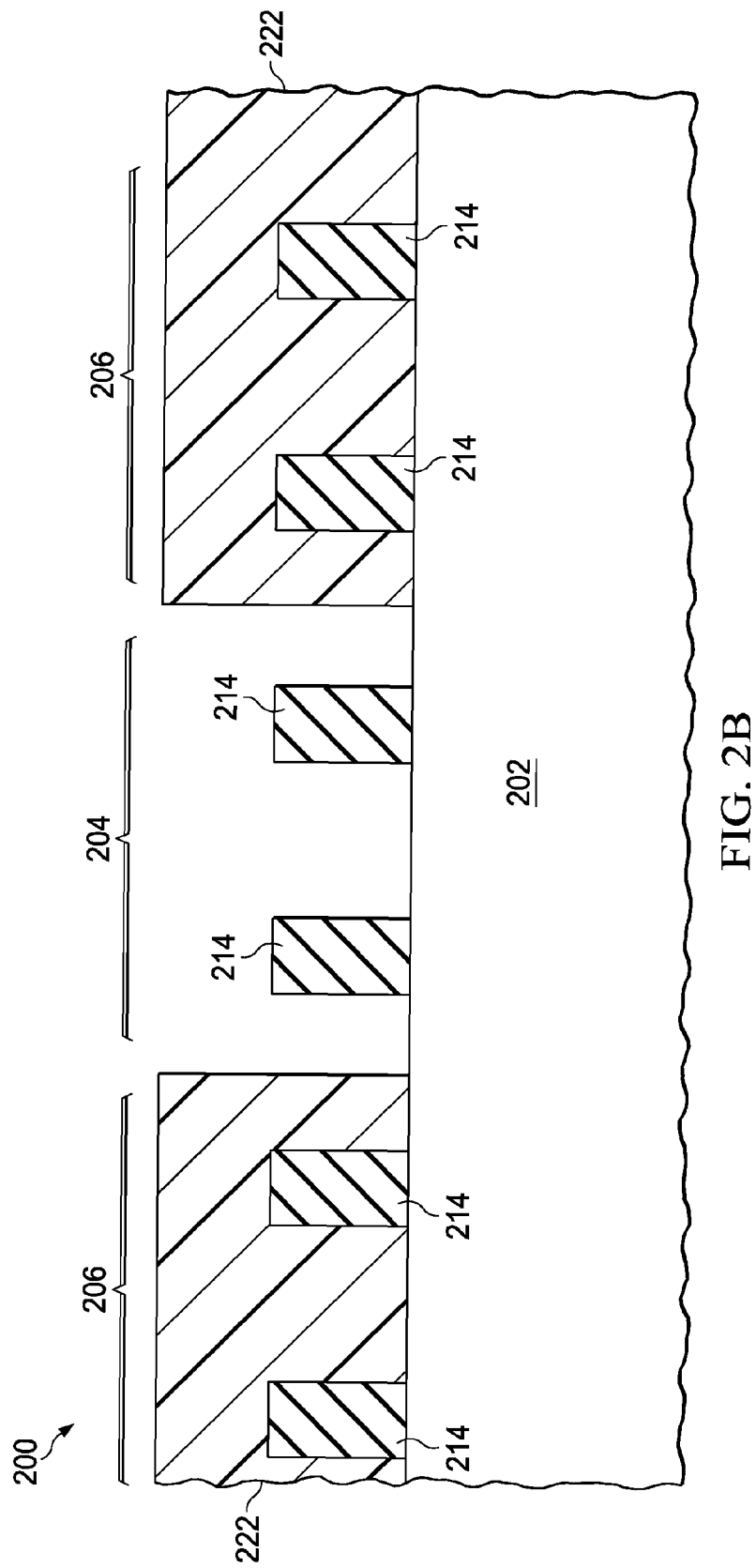

Referring to FIG. 2B, an etch mask 222 is formed over the mandrels 214 which exposes the area for the first plurality of fins 204 and covers the areas for the second plurality of fins 206. The etch mask 222 may, in one example, include photoresist and be formed by a photolithographic process. In another example, the etch mask 222 may include photo-insensitive material and be formed as described in reference to FIG. 1B and FIG. 1C. The etch mask 222 may be formed using a low resolution process which advantageously reduces a fabrication cost of the integrated circuit 200.

Figure 2C:
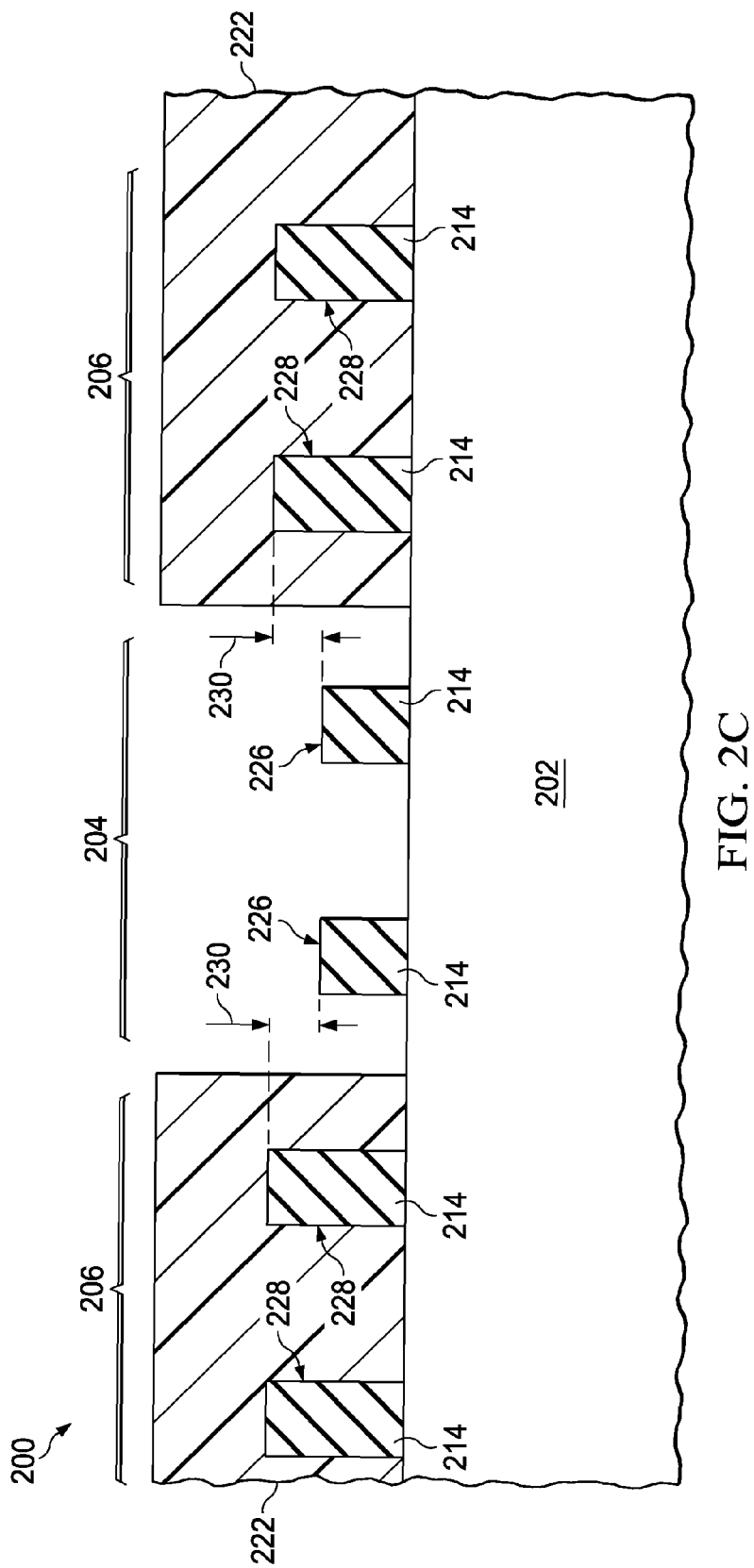

Referring to FIG. 2C, instances 226 of the mandrels 214 in the area of the first plurality of fins 204 are shortened, for example by an anisotropic etch. The shortening process may not substantially decrease the widths 218 of the instances 226 of the mandrels 214 in the area of the first plurality of fins 204. Instances 228 of the mandrels 214 in the areas of the second plurality of fins 206 are protected by the etch mask 222 and so are not substantially affected by the shortening process. After the shortening process is completed, the instances 226 of the mandrels 214 in the area of the first plurality of fins 204 may be shorter than the instances 228 of the mandrels 214 in the areas of the second plurality of fins 206 by a vertical distance 230 of, for example, one to three times the desired width of the to-be-formed second plurality of fins 206.

After the shortening process is completed, the etch mask 222 is removed. The etch mask 222 may be removed using an etch process which does not substantially degrade the mandrels 214 or substrate 202. Organic material in the layer of etch mask 222 may be removed using an asher process or a wet clean process using an aqueous solution of sulfuric acid and hydrogen peroxide. Silicon dioxide in the etch mask 222 may be removed using an isotropic plasma etch process or an aqueous buffered solution of hydrofluoric acid. Silicon nitride in the etch mask 222 may be removed using an isotropic plasma etch process.

Figure 2D:
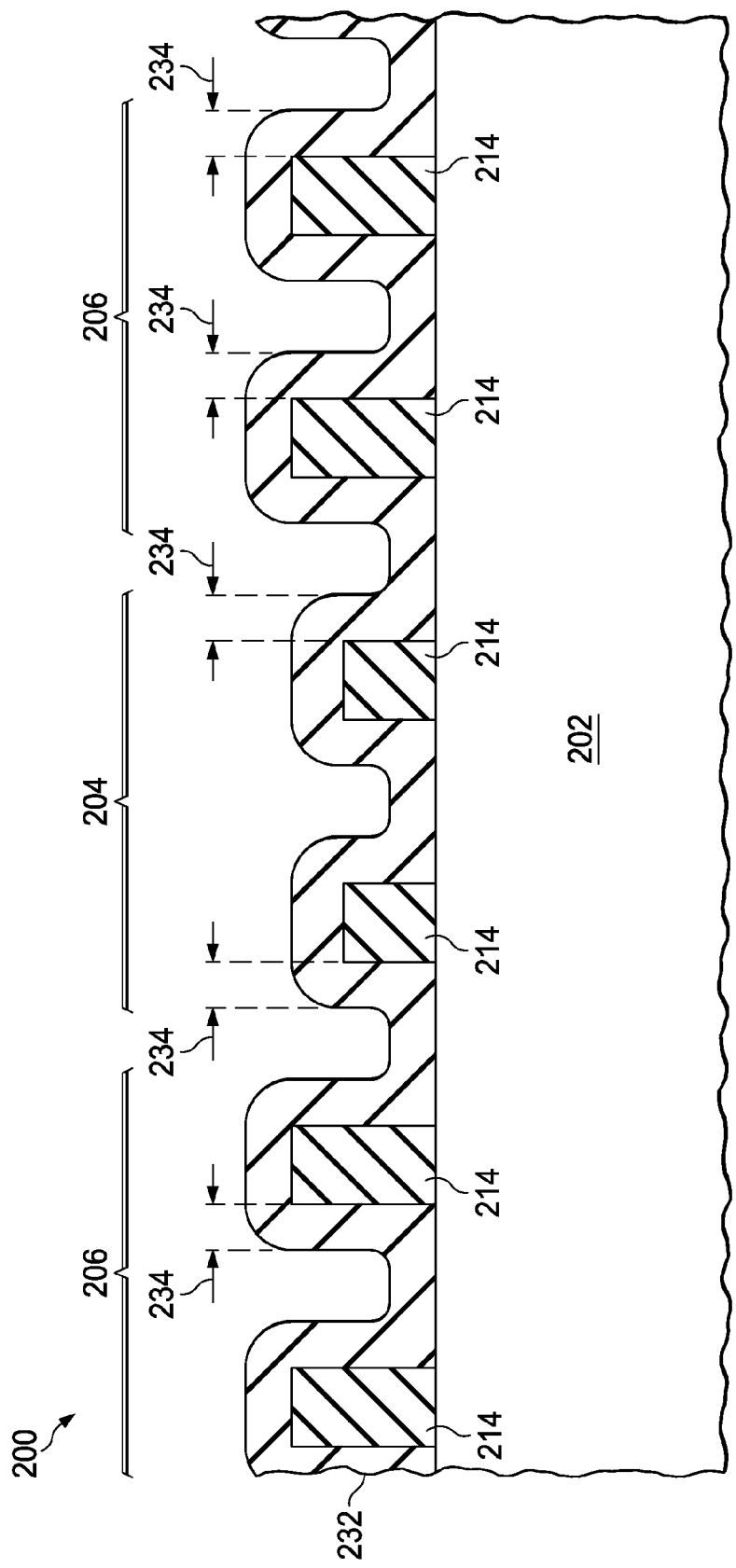

Referring to FIG. 2D, a layer of spacer material 232 is conformally formed over the mandrels 214 and the layer of gate material 212. The layer of spacer material 232 may include, for example, silicon dioxide or silicon nitride. A horizontal thickness 234 of the layer of spacer material 232 on lateral surfaces of the mandrels 214 is approximately the desired width of the to-be-formed second plurality of fins 206.

Figure 2E:
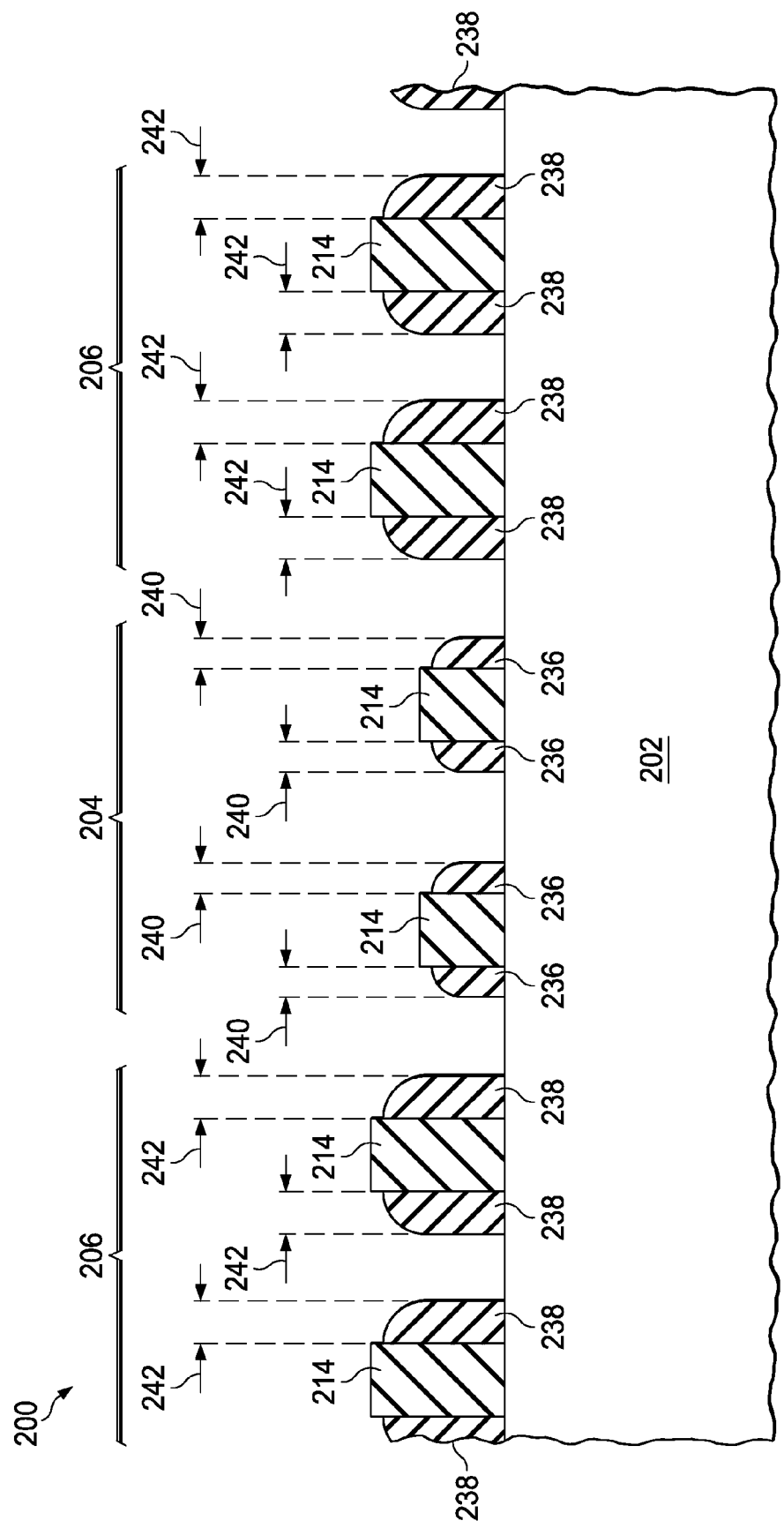

Referring to FIG. 2E, the layer of spacer material 232 of FIG. 2D is anisotropically etched back to form a first plurality of spacers 236 on the instances 226 of the mandrels 214 in the area of the first plurality of fins 204 and to form a second plurality of spacers 238 on the instances 228 of the mandrels 214 in the areas of the second plurality of fins 206. The anisotropic etchback is performed so that a horizontal thickness 240 of the first plurality of spacers 236 is less than a horizontal thickness 242 of the second plurality of spacers 238. The horizontal thickness 240 of the first plurality of spacers 236 is approximately the desired width of the to-be-formed first plurality of fins 204. The horizontal thickness 242 of the second plurality of spacers 238 is approximately the desired width of the to-be-formed second plurality of fins 206.

Figure 2F:
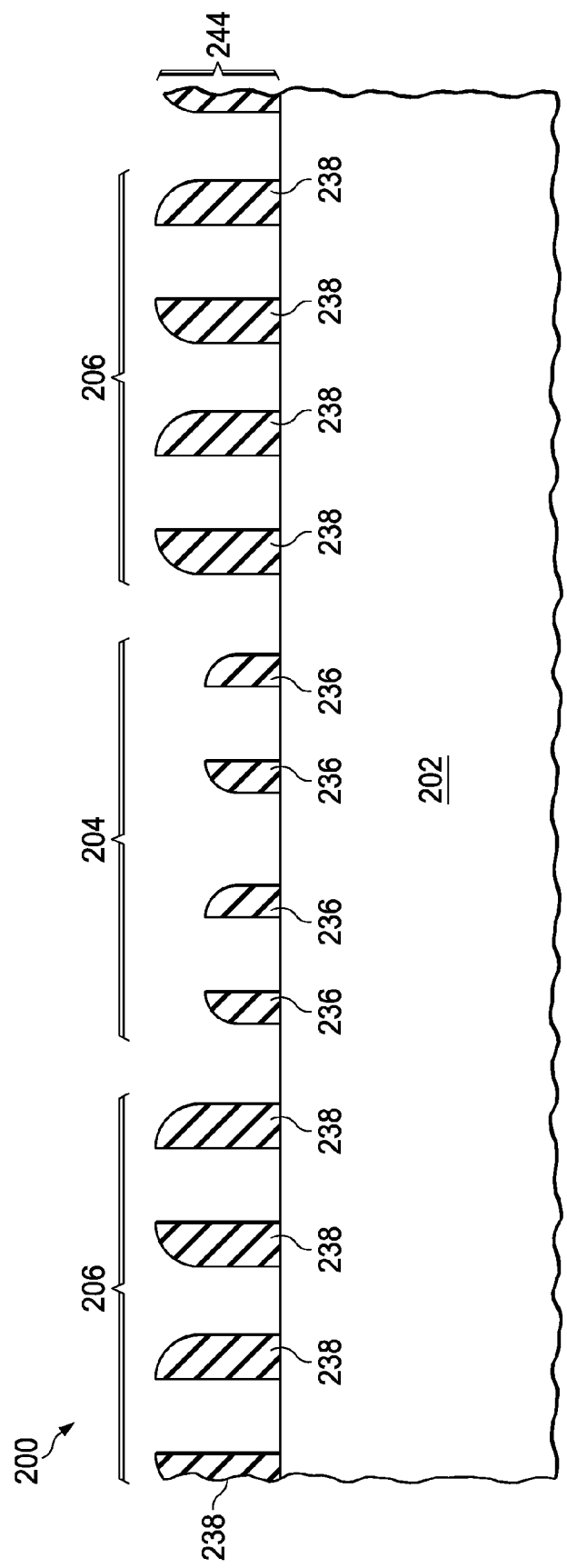

Referring to FIG. 2F, the mandrels 214 of FIG. 2E are removed, leaving the first plurality of spacers 236 and the second plurality of spacers 238 in place to form a spacer-based etch mask 244. The mandrels 214 may be removed using a wet etch which is selective to the spacers 236 and 238 and the substrate 202. For example, silicon dioxide in the mandrels 214 of may be removed using a dilute aqueous etch of buffered hydrofluoric acid. In another example, polyimide in the mandrels 214 of may be removed using an asher process followed by a wet clean step using an aqueous mixture of sulfuric acid and hydrogen peroxide.

Figure 2G:
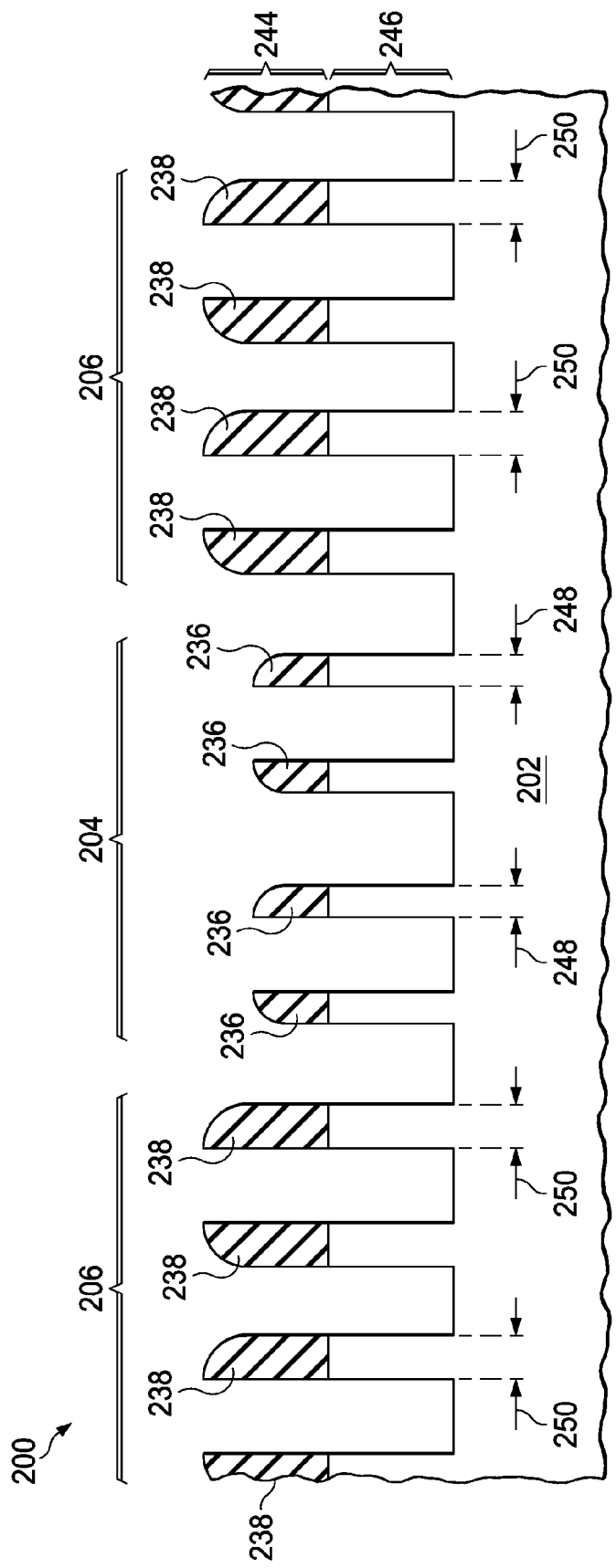

Referring to FIG. 2G, the substrate 202 of FIG. 2F is etched using the spacer-based etch mask 244 to form fins 246 including the first plurality of fins 204 and the second plurality of fins 206. A width 248 of the first plurality of fins 204 is less than a width 250 of the second plurality of fins 206. The etch process may be a time etch to provide a desired height of the fins 246.

Figure 2H:
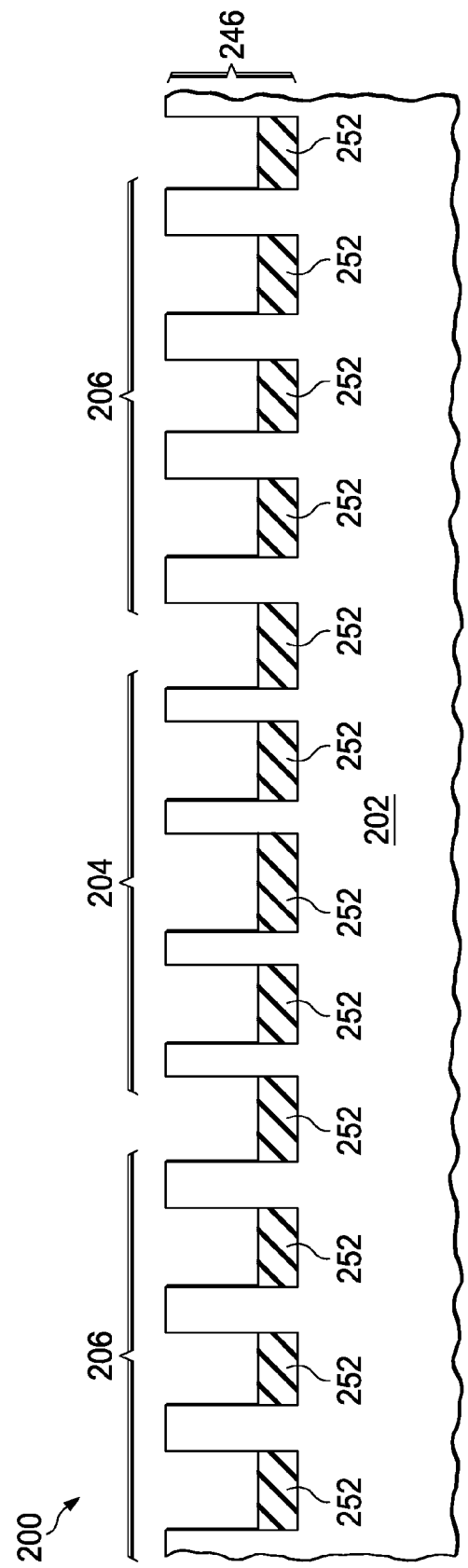

Referring to FIG. 2H, the spacer-based etch mask 244 of FIG. 2G is removed, leaving the fins 246 in place. The spacer-based etch mask 244 may be removed using an etch process which is selective to the semiconductor material of the substrate 202 and the fins 246. Silicon dioxide in the spacer-based etch mask 244 may be removed using a dilute aqueous etch of buffered hydrofluoric acid. Silicon nitride in the spacer-based etch mask 244 may be removed using a plasma etch with fluorine radicals. Isolation oxide 252 may be formed on the substrate 202 between the fins 246 as part of field oxide formation.

Figure 3A:
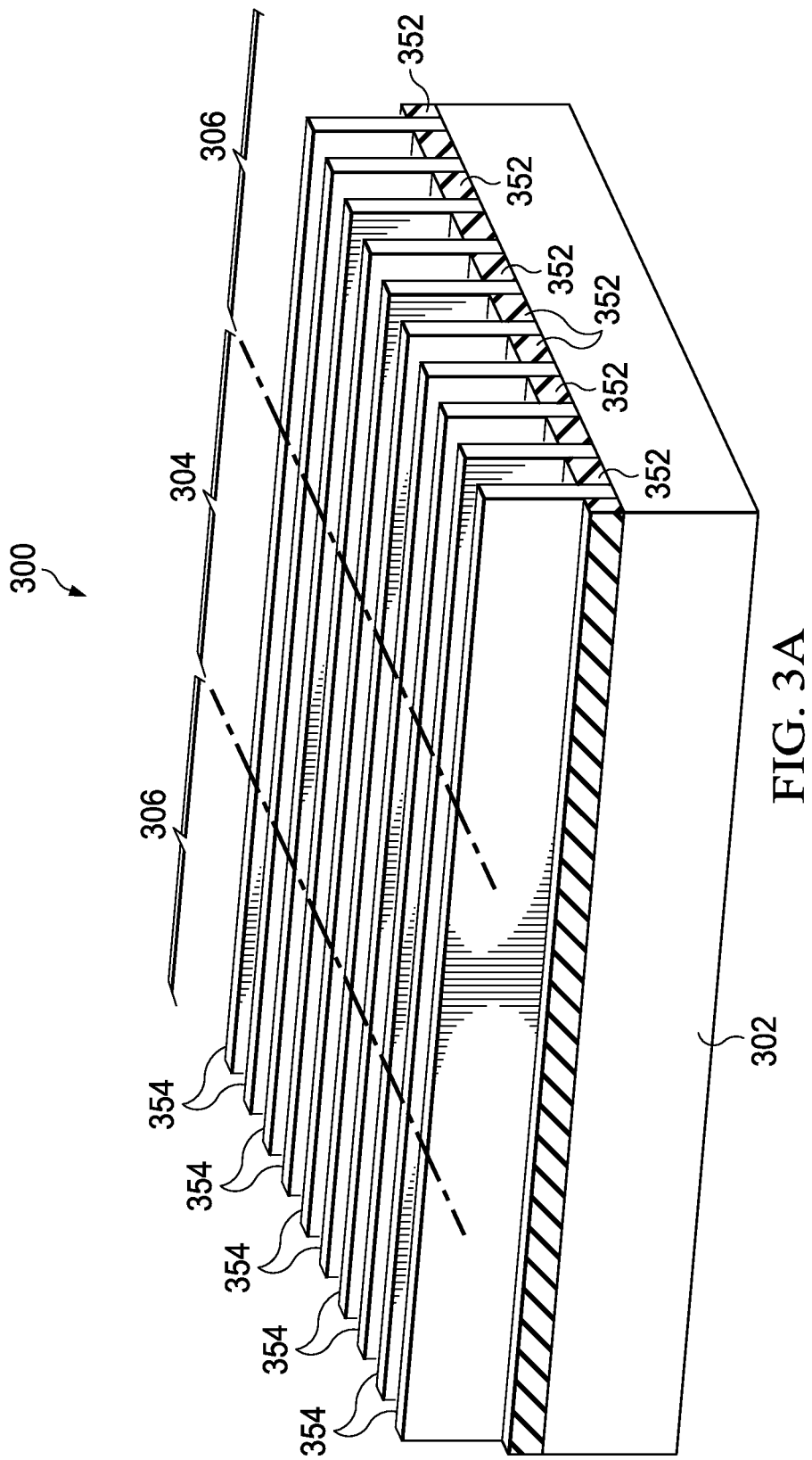
FIG. 3A through FIG. 3H are cross sections of an integrated circuit containing finFETs formed by a further example process sequence, depicted in successive stages of fabrication.

FIG. 3A through FIG. 3H are cross sections of an integrated circuit containing finFETs formed by a further example process sequence, depicted in successive stages of fabrication. Referring to FIG. 3A, the integrated circuit 300 is formed on a substrate 302 with semiconductor material at a top surface, such as a silicon wafer. Fins 354 are formed at the top surface of the substrate 302. Isolation oxide 352 may be formed over the substrate 302 between the fins 354. The integrated circuit 300 includes at least one area for a first plurality of fins 304 of finFETs and at least one area for a second plurality of fins 306 of finFETs. A desired width of the to-be-formed first plurality of fins 304 is less than a desired width of the to-be-formed second plurality of fins 306.

Figure 3B:
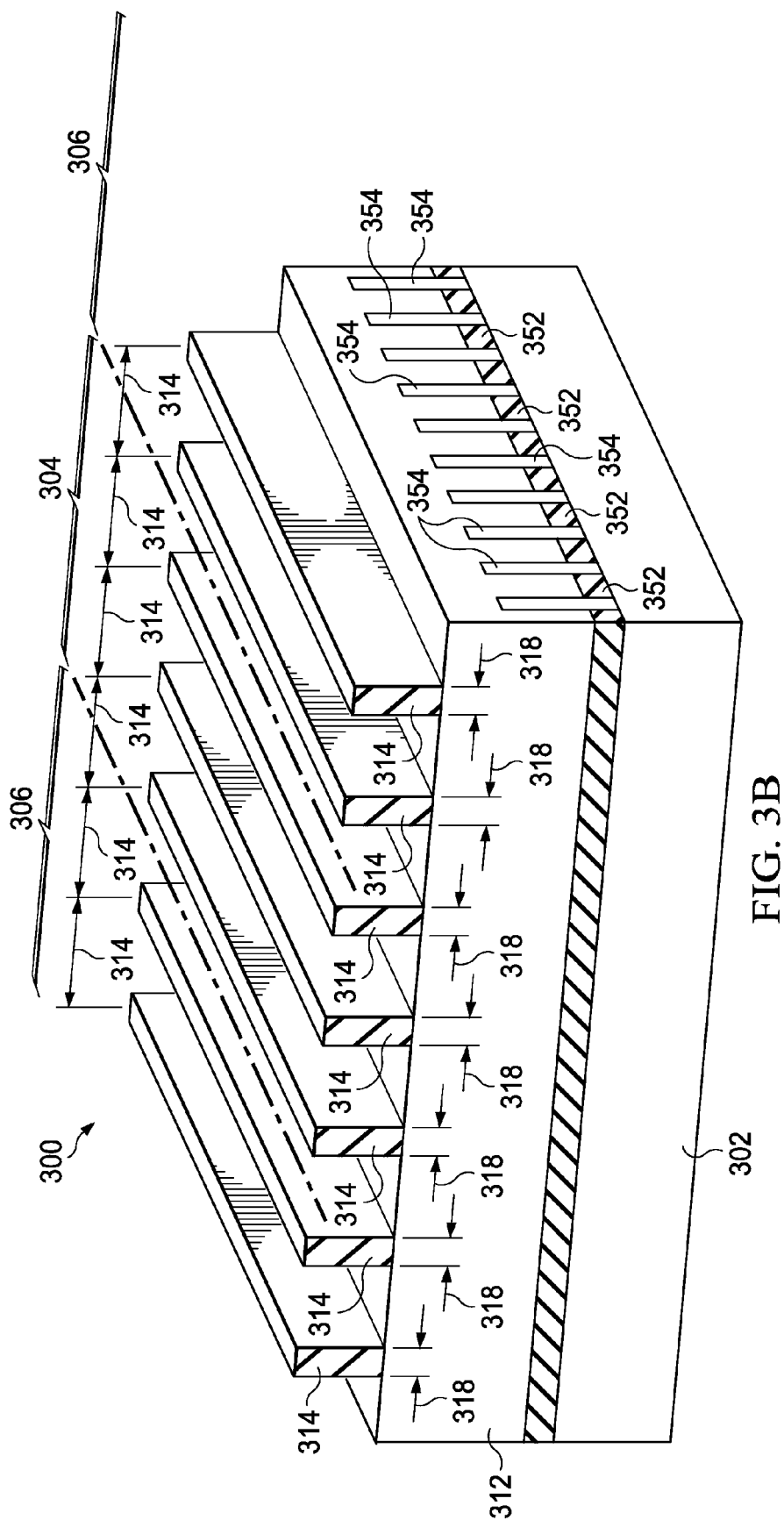

Referring to FIG. 3B, layer of gate material 312 is formed over the fins 354 extending down to the isolation oxide 352. The layer of gate material 312 may include polysilicon, and/or may include metallic gate material such as titanium nitride or tantalum nitride. The layer of gate material 312 covers the fins 354.

Mandrels 314 are formed over the layer of gate material 312 with pitch distances 316 which are twice as long as desired pitch distances of gates of the first plurality of gates 304 and the second plurality of gates 306. The mandrels 314 may be formed with widths 318 which provide desired separations between adjacent instances of the first plurality of gates 304 and the second plurality of gates 306. The mandrels 314 may include, for example, silicon dioxide and/or silicon nitride, and be formed by forming a layer of mandrel material over the layer of gate material 312, forming an etch mask of photoresist on the layer of mandrel material and etching the mandrel material using an RIE process. Alternately, the mandrels 314 may be formed of photosensitive polyimide using a photolithographic process. Other materials and methods of formation for the mandrels 314 are within the scope of the instant example. A height of the mandrels 314 may be, for example, two to four times the desired width of the second plurality of gates 306.

Figure 3C:
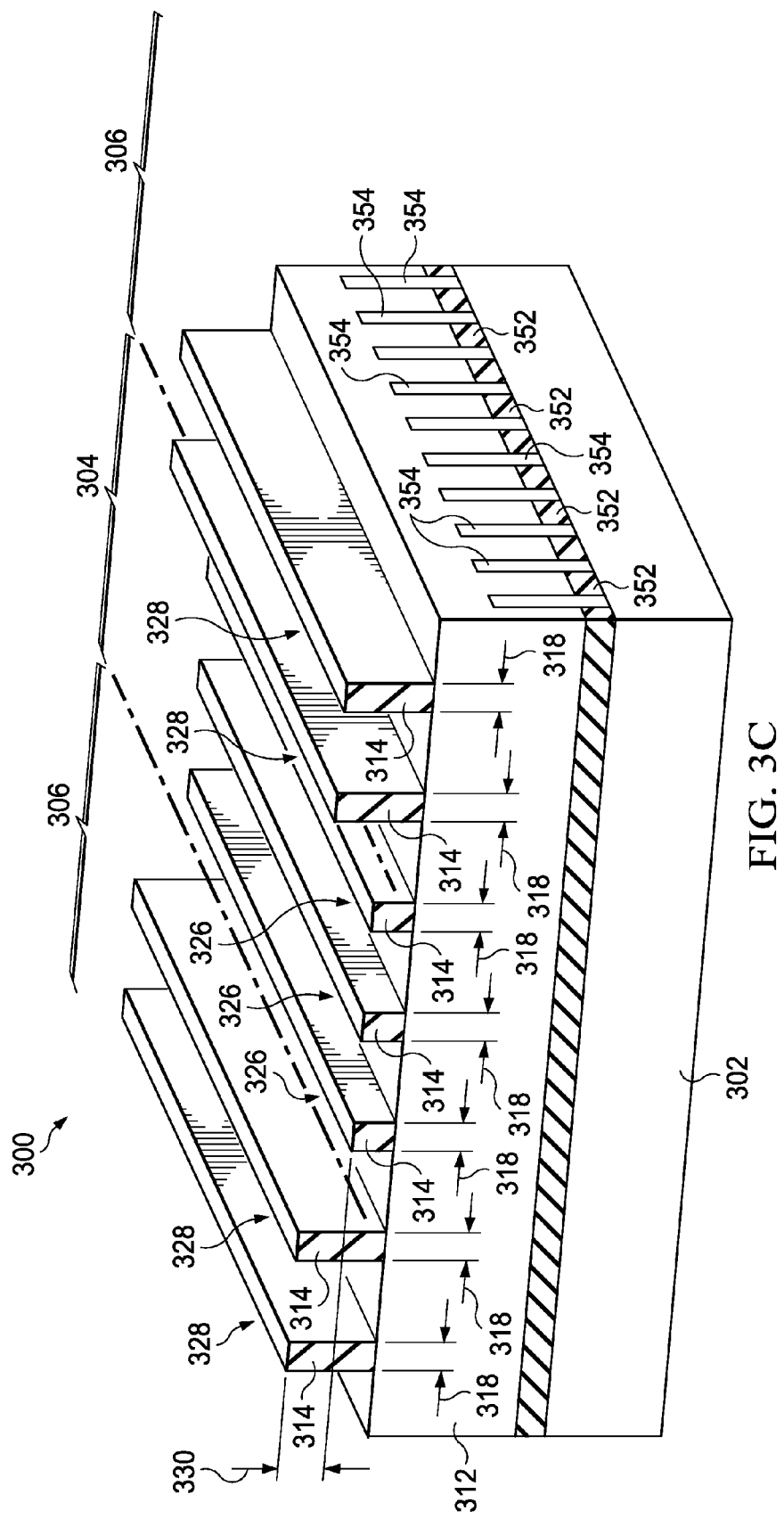

Referring to FIG. 3C, instances 326 of the mandrels 314 in the area of the first plurality of gates 304 are shortened, for example as described in reference to FIG. 1B through FIG. 1D. The shortening process may not substantially decrease the widths 318 of the instances 326 of the mandrels 314 in the area of the first plurality of gates 304. Instances 328 of the mandrels 314 in the areas of the second plurality of gates 306 are protected by the layer of mask material 322 and so are not substantially affected by the shortening process. After the shortening process is completed, the instances 326 of the mandrels 314 in the area of the first plurality of gates 304 may be shorter than the instances 328 of the mandrels 314 in the areas of the second plurality of gates 306 by a vertical distance 330 of, for example, one to three times the desired width of the to-be-formed second plurality of gates 306.

Figure 3D:
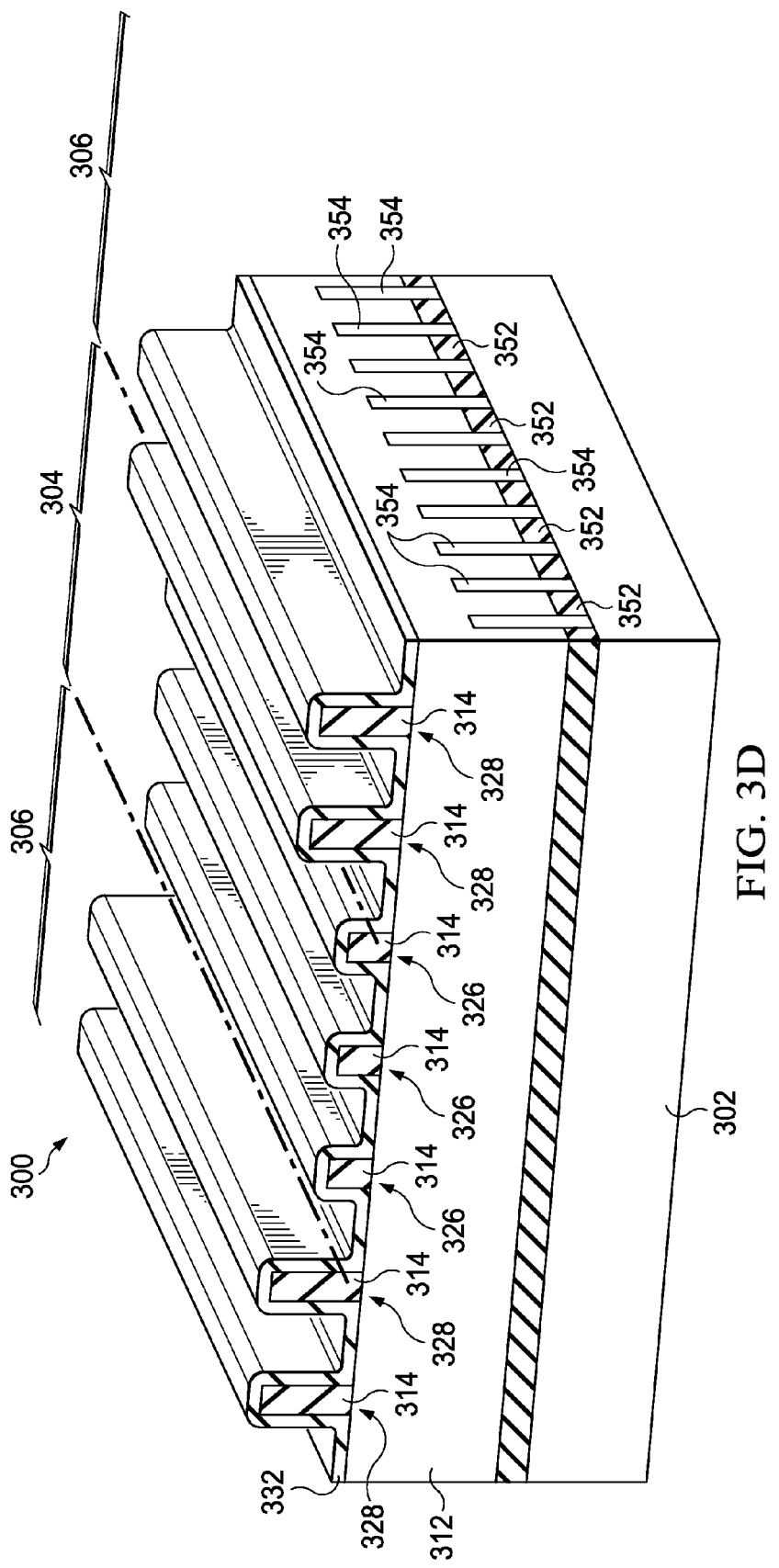

Referring to FIG. 3D, a layer of spacer material 332 is conformally formed over the mandrels 314 and the layer of gate material 312. The layer of spacer material 332 may include, for example, silicon dioxide or silicon nitride. A horizontal thickness 334 of the layer of spacer material 332 on lateral surfaces of the mandrels 314 is approximately the desired width of the to-be-formed second plurality of gates 306.

Figure 3E:
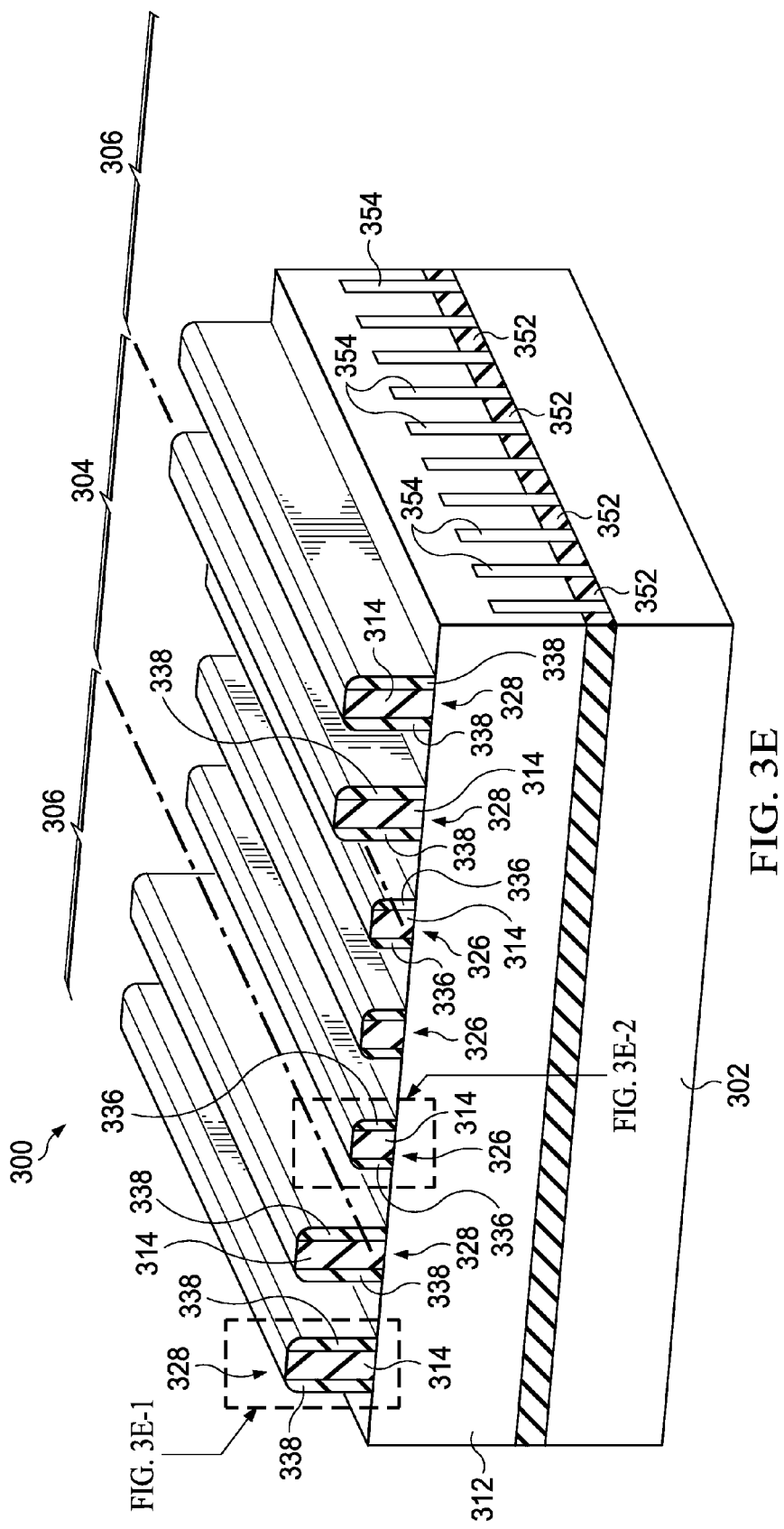
Figures 1, 3E:
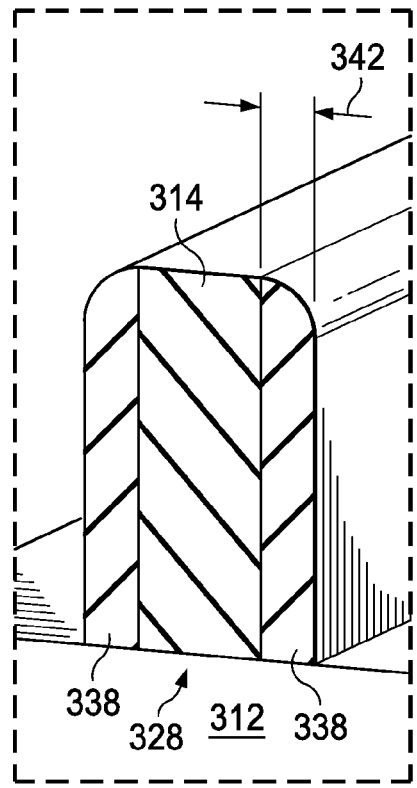
Figures 2, 3E:
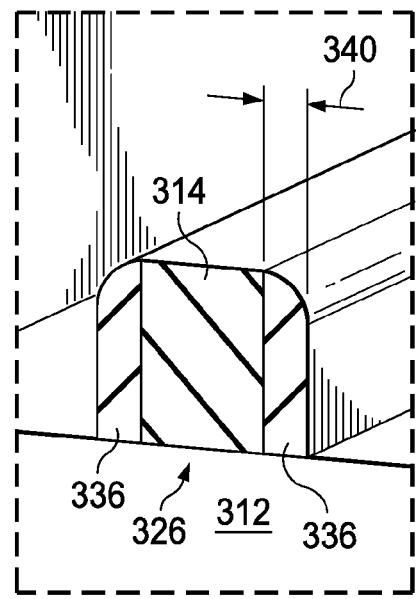

Referring to FIG. 3E, FIG. 3E-1 and FIG. 3E-2, the layer of spacer material 332 of FIG. 3D is anisotropically etched back to form a first plurality of spacers 336 on the instances 326 of the mandrels 314 in the area of the first plurality of gates 304 and to form a second plurality of spacers 338 on the instances 328 of the mandrels 314 in the areas of the second plurality of gates 306. The anisotropic etchback is performed so that a horizontal thickness 340 of the first plurality of spacers 336 is less than a horizontal thickness 342 of the second plurality of spacers 338. The horizontal thickness 340 of the first plurality of spacers 336 is approximately the desired width of the to-be-formed first plurality of gates 304. The horizontal thickness 342 of the second plurality of spacers 338 is approximately the desired width of the to-be-formed second plurality of gates 306.

Figure 3F:
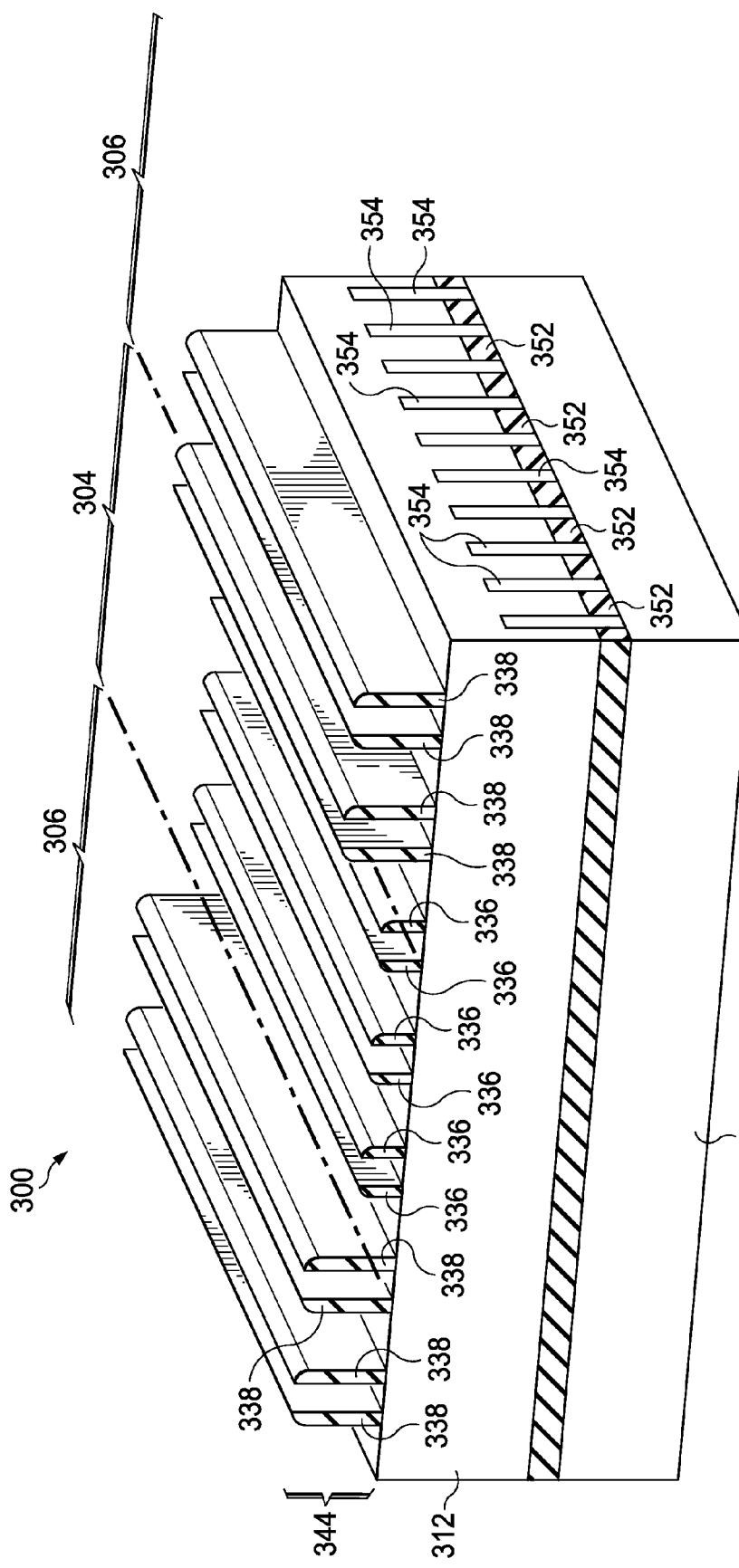

Referring to FIG. 3F, the mandrels 314 of FIG. 3E are removed, leaving the first plurality of spacers 336 and the second plurality of spacers 338 in place to form a spacer-based etch mask 344. The mandrels 314 may be removed, for example, as described in reference to FIG. 1G.

Figure 3G:
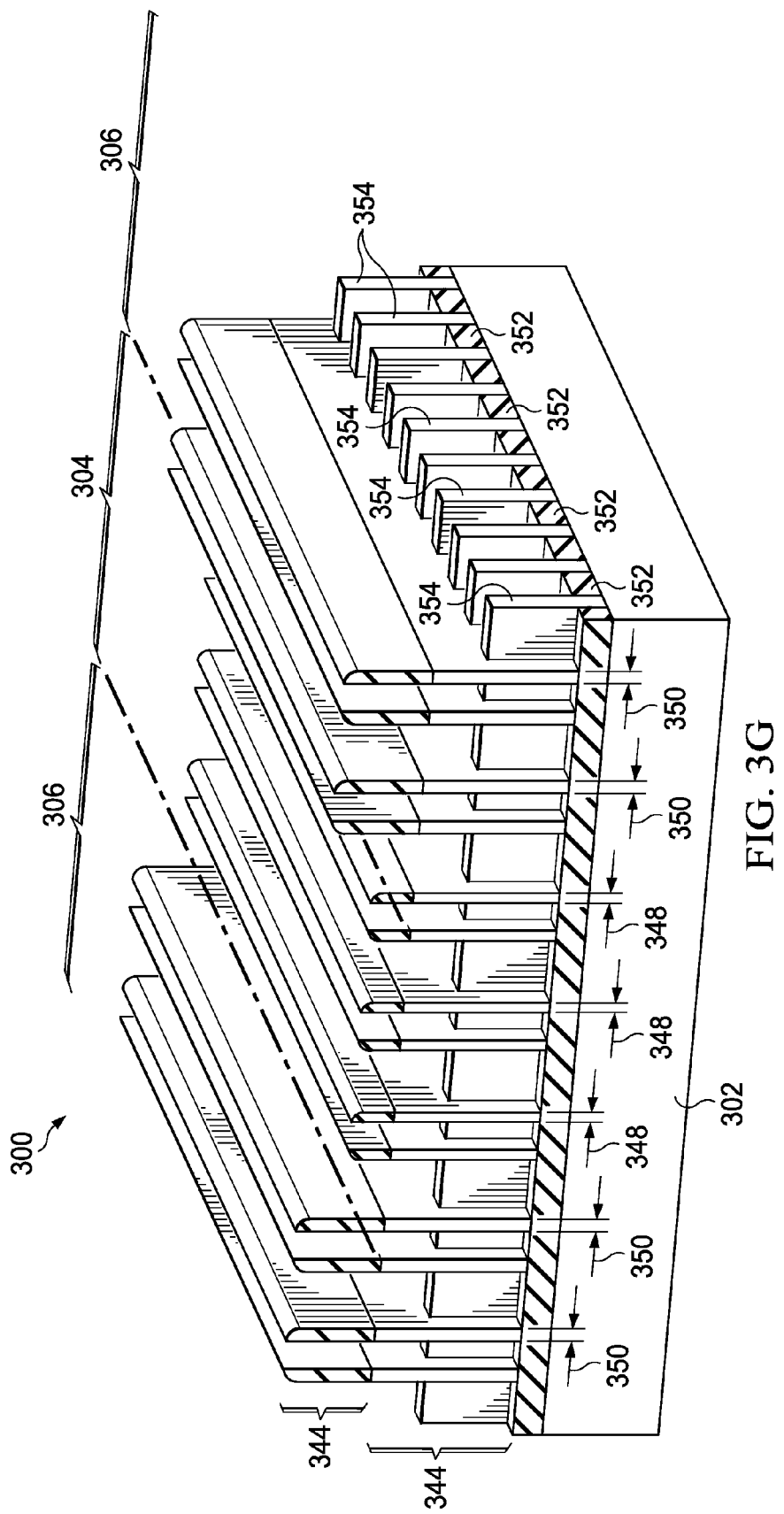

Referring to FIG. 3G, the layer of gate material 312 of FIG. 3F is etched using the spacer-based etch mask 344 to form gates 346 including the first plurality of gates 304 and the second plurality of gates 306. A width 348 of the first plurality of gates 304 is less than a width 350 of the second plurality of gates 306.

Figure 3H:
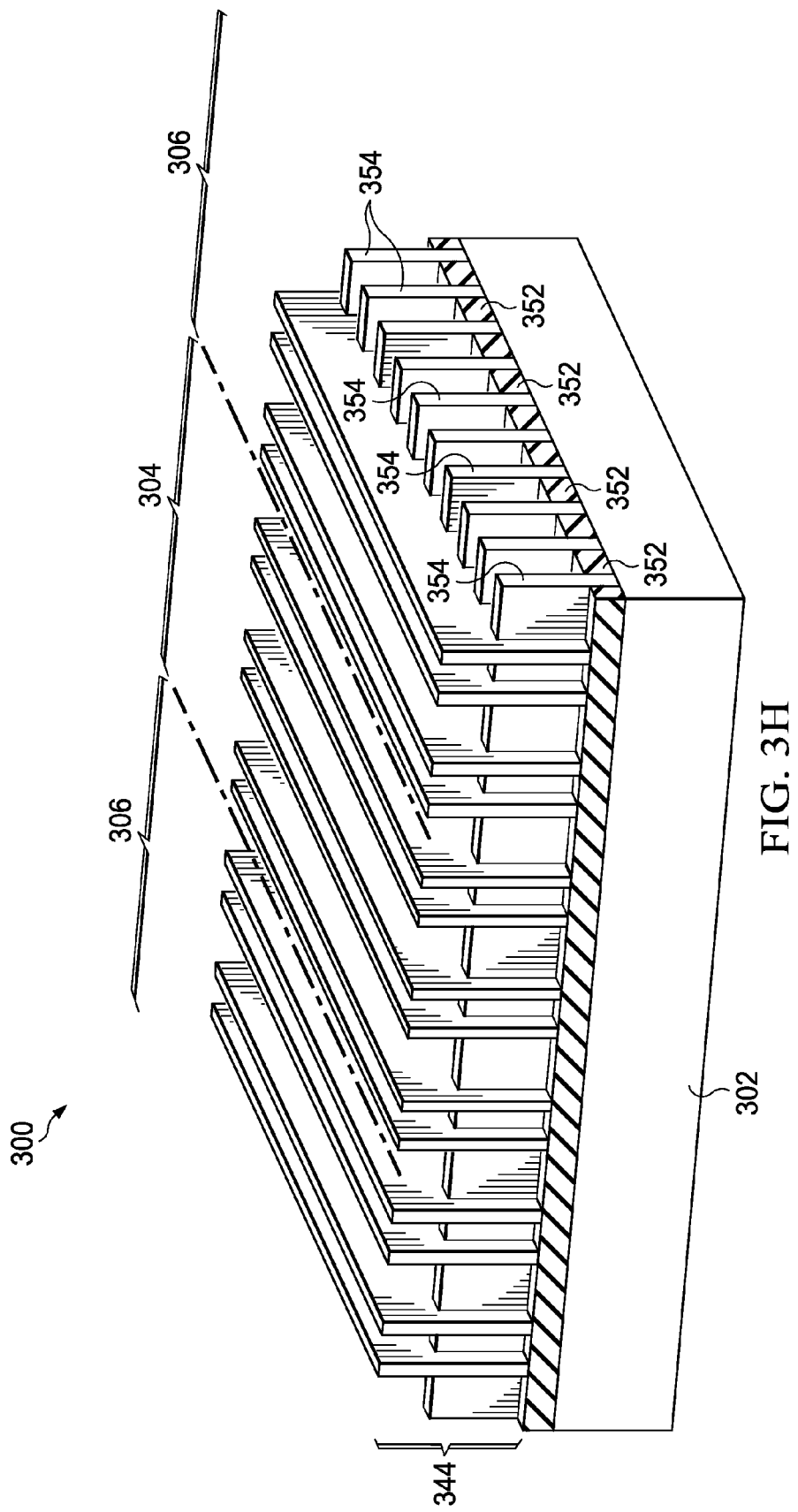

Referring to FIG. 3H, the spacer-based etch mask 344 of FIG. 3G is removed, leaving the gates 346 in place. The spacer-based etch mask 344 may be removed using an etch process which is selective to the gates 346. Silicon dioxide in the spacer-based etch mask 344 may be removed using a dilute aqueous etch of buffered hydrofluoric acid after protecting the gate dielectric layer 310, possibly with a spin-on coating. Silicon nitride in the spacer-based etch mask 344 may be removed using a plasma etch with fluorine radicals. The gates 346 may possibly be replaced with metal gates in subsequent processing.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. A method of forming an integrated circuit, comprising the steps of:
   providing a layer of material for linear structures;
   forming a plurality of mandrels over the layer of material for the linear structures, the mandrels having pitch distances which are twice as long as desired pitch distances of the linear structures;
   shortening a first set of mandrels of the plurality of the mandrels in an area for a first plurality of the linear structures, so that a second set of mandrels of the plurality of the mandrels in an area for a second plurality of the linear structures are not substantially shortened;

forming a layer of spacer material conformally over the first set of the mandrels, the second set of the mandrels, and the layer of material for the linear structures;

anisotropically etching back the layer of spacer material to form a first plurality of spacers on the first set of the mandrels in the area for the first plurality of the linear structures and form a second plurality of spacers on the second set of the mandrels in the area for the second plurality of the linear structures, so that a horizontal thickness of the first plurality of spacers is less than a horizontal thickness of the second plurality of spacers;

removing the mandrels, leaving the first plurality of spacers and the second plurality of spacers in place to form a spacer-based etch mask; and etching the layer of material for the linear structures using the spacer-based etch mask to form the linear structures including the first plurality of the linear structures and the second plurality of the linear structures, wherein a width of the first plurality of linear structures is less than a width of the second plurality of linear structures.

2. The method of claim 1, in which:
the layer of material for the linear structures includes polysilicon; and
the linear structures are gates of planar metal oxide semiconductor (MOS) transistors.

3. The method of claim 1, in which:
the layer of material for the linear structures includes crystalline silicon of a substrate of the integrated circuit; and
the linear structures are fins of fin field effect transistors (finFETs).

4. The method of claim 1, in which:
the layer of material for the linear structures includes polysilicon; and
the linear structures are gates of finFETs.

5. The method of claim 1, wherein the mandrels include silicon dioxide.

6. The method of claim 1, wherein the layer of spacer material includes silicon nitride.

7. The method of claim 1, wherein the step of shortening the first set of the mandrels in the area for the first plurality of the linear structures is performed so that the first set of the mandrels in the area of the first plurality of linear structures are shorter than the second set of the mandrels in the areas of the second plurality of linear structures by a vertical distance of one to three times a desired width of the second plurality of linear structures.

8. The method of claim 1, wherein the step of forming the layer of spacer material is performed so that a horizontal thickness of the layer of spacer material on lateral surfaces of the mandrels is approximately a desired width of the second plurality of linear structures.

9. A method of forming an integrated circuit, comprising the steps of:
providing a substrate comprising semiconductor material;
forming a layer of gate material comprising polysilicon over the substrate;
forming a plurality of mandrels over the layer of gate material for gates of transistors, including a first plurality of the gates and a second plurality of the gates, the mandrels having pitch distances which are twice as long as desired pitch distances of the gates;
forming a layer of mask material over the mandrels;

removing the layer of mask material in an area for the first plurality of the gates and leaving the layer of mask material in an area for the second plurality of the gates;

shortening a first set of the mandrels in the area for the first plurality of the gates, so that a second set of the mandrels in the area for the second plurality of the gates are not substantially shortened;

forming a layer of spacer material conformally over the mandrels and the layer of material for the gates;

anisotropically etching back the layer of spacer material to form a first plurality of spacers on the first set of the mandrels in the area for the first plurality of the gates and form a second plurality of spacers on the second set of the mandrels in the area for the second plurality of the gates, so that a horizontal thickness of the first plurality of the spacers is less than a horizontal thickness of the second plurality of the spacers;

removing the mandrels, leaving the first plurality of spacers and the second plurality of spacers in place to form a spacer-based etch mask;

etching the layer of material for the gates using the spacer-based etch mask to form the gates including the first plurality of the gates and the second plurality of the gates, wherein a width of the first plurality of the gates is less than a width of the second plurality of the gates; and removing the spacer-based etch mask.

10. The method of claim 9, wherein the transistors are planar MOS transistors.

11. The method of claim 9, wherein the transistors are finFETs.

12. The method of claim 9, wherein the mandrels include silicon dioxide.

13. The method of claim 9, wherein the layer of spacer material includes silicon nitride.

14. The method of claim 9, wherein the step of shortening the first set of the mandrels in the area for the first plurality of the gates is performed so that the first set of the mandrels in the area of the first plurality of the gates are shorter than the second set of the mandrels in the areas of the second plurality of the gates by a vertical distance of one to three times a desired width of the second plurality of the gates.

15. The method of claim 9, wherein the step of forming the layer of spacer material is performed so that a horizontal thickness of the layer of spacer material on lateral surfaces of the mandrels is approximately a desired width of the second plurality of the gates.

16. A method of forming an integrated circuit, comprising the steps of:
providing a substrate comprising semiconductor material;
forming a plurality of mandrels over the substrate for fins of finFETs, including a first plurality of the fins and a second plurality of the fins, the mandrels having pitch distances which are twice as long as desired pitch distances of the fins;
forming an etch mask over the mandrels which exposes an area for the first plurality of the fins and covers the substrate in an area for the second plurality of the fins;
shortening a first set of the mandrels in the area for the first plurality of the fins, so that a second set of the mandrels in the area for the second plurality of the fins are not substantially shortened;
removing the etch mask;
forming a layer of spacer material conformally over the mandrels and the substrate;
anisotropically etching back the layer of spacer material to form a first plurality of spacers on the first set of the mandrels in the area for the first plurality of the fins and form a second plurality of spacers on the second set of the mandrels in the area for the second plurality of the fins, so that a horizontal thickness of the first plurality of the spacers is less than a horizontal thickness of the second plurality of the spacers;

removing the mandrels, leaving the first plurality of spacers and the second plurality of spacers in place to form a spacer-based etch mask;

etching the substrate using the spacer-based etch mask to form the fins including the first plurality of the fins and the second plurality of the fins, wherein a width of the first plurality of the fins is less than a width of the second plurality of the fins; and removing the spacer-based etch mask.

17. The method of claim 16, wherein the mandrels include silicon dioxide.

18. The method of claim 16, wherein the layer of spacer material includes silicon nitride.

19. The method of claim 16, wherein the step of shortening the first set of the mandrels in the area for the first plurality of the fins is performed so that the first set of the mandrels in the area of the first plurality of the fins are shorter than the second set of the mandrels in the areas of the second plurality of the fins by a vertical distance of one to three times a desired width of the second plurality of the fins.

20. The method of claim 16, wherein the step of forming the layer of spacer material is performed so that a horizontal thickness of the layer of spacer material on lateral surfaces of the mandrels is approximately a desired width of the second plurality of the fins.

* * * * *